United States Patent
Karashima

(10) Patent No.: US 12,550,797 B2
(45) Date of Patent: Feb. 10, 2026

(54) SEMICONDUCTOR DEVICE

(71) Applicant: RENESAS ELECTRONICS CORPORATION, Tokyo (JP)

(72) Inventor: Takashi Karashima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 418 days.

(21) Appl. No.: 18/170,678

(22) Filed: Feb. 17, 2023

(65) Prior Publication Data

US 2023/0352382 A1    Nov. 2, 2023

(30) Foreign Application Priority Data

May 2, 2022    (JP) .................... 2022-075783

(51) Int. Cl.
*H01L 23/498*    (2006.01)
*H01L 23/00*    (2006.01)
(Continued)

(52) U.S. Cl.
CPC ........ *H01L 23/49816* (2013.01); *H01L 23/16* (2013.01); *H01L 23/3128* (2013.01);
(Continued)

(58) Field of Classification Search
CPC ............... H01L 23/49816; H01L 23/16; H01L 23/3128; H01L 23/49822; H01L 24/48; H01L 24/32; H01L 24/73; H01L 2224/32225; H01L 2224/48227; H01L 2224/73265

See application file for complete search history.

(56) References Cited

U.S. PATENT DOCUMENTS 6,064,113 A      5/2000  Kirkman
6,548,907 B1 *   4/2003  Yamada ............... H01L 23/50
                                              257/E23.079
(Continued)

FOREIGN PATENT DOCUMENTS

JP    2003-273286 A    9/2003
JP    2008-098251 A    4/2008
(Continued)

OTHER PUBLICATIONS

Notice of Reasons for Refusal received in corresponding Japanese Patent Application No. 2022-075783, dated May 13, 2025.

*Primary Examiner* — Benjamin Tzu-Hung Liu
(74) *Attorney, Agent, or Firm* — Rimon P.C.

(57) ABSTRACT

A wiring substrate includes a first insulating layer, a first conductive layer, a second insulating layer, a second conductive layer, a third conductive layer, a third insulating layer, and a fourth conductive layer. Given that an occupancy ratio of a first conductive pattern in the first conductive layer is a first occupancy ratio, an occupancy ratio of a second conductive pattern in the second conductive layer is a second occupancy ratio, an occupancy ratio of a third conductive pattern in the third conductive layer is a third occupancy ratio, and an occupancy ratio of a fourth conductive pattern in the fourth conductive layer is a fourth occupancy ratio, each of the first occupancy ratio and the third occupancy ratio is greater than each of the second occupancy ratio and the fourth occupancy ratio.

12 Claims, 13 Drawing Sheets

(51) Int. Cl.
*H01L 23/16* (2006.01)
*H01L 23/31* (2006.01)

(52) U.S. Cl.
CPC ........ *H01L 23/49822* (2013.01); *H01L 24/48* (2013.01); *H01L 24/32* (2013.01); *H01L 24/73* (2013.01); *H01L 2224/32225* (2013.01); *H01L 2224/48227* (2013.01); *H01L 2224/73265* (2013.01)

(56) References Cited

U.S. PATENT DOCUMENTS

| | | |
|---|---|---|
| 10,304,767 B2 | 5/2019 | Kobayashi |
| 2005/0110164 A1 | 5/2005 | Pendse |
| 2007/0164445 A1* | 7/2007 | Ejima .................... H01L 24/13 257/E21.503 |
| 2008/0083984 A1 | 4/2008 | Kagawa |
| 2014/0138836 A1* | 5/2014 | Nagasawa ......... H01L 23/49838 257/766 |
| 2018/0090429 A1* | 3/2018 | Kobayashi ............ H01L 21/565 |
| 2021/0134724 A1* | 5/2021 | Rubin ................. H01L 23/5385 |

FOREIGN PATENT DOCUMENTS

| | | |
|---|---|---|
| JP | 2008-535225 A | 8/2008 |
| JP | 2018-186197 A | 11/2018 |

\* cited by examiner

SEMICONDUCTOR DEVICE

CROSS-REFERENCE TO RELATED APPLICATIONS

The disclosure of Japanese Patent Application No. 2022-075783 filed on May 2, 2022 including the specification, drawings and abstract is incorporated herein by reference in its entirety.

BACKGROUND

The present invention relates to a semiconductor device, and more particularly to a semiconductor device including a wiring substrate having a chip mounting surface with a side length of 20 mm or more and a semiconductor chip with an area of less than 10% of an area of the chip mounting surface.

There is a semiconductor device referred to as mold array package-ball grid array (MAP-BGA) in which a semiconductor chip mounted on a wiring substrate composed of an insulating layer and wiring layers formed on front and back surfaces of the insulating layer and electrodes formed on a front surface of the wiring substrate are electrically connected to each other via bonding wires and the bonding wires and the semiconductor chip are sealed with resin by the batch molding method (e.g., see Patent Document 1 (Japanese Unexamined Patent Application Publication No. 2018-186197)).

There is disclosed a technique listed below.
[Patent Document 1] Japanese Unexamined Patent Application Publication No. 2018-186197

SUMMARY

The recent advancement in the functionality of semiconductor devices has led to the tendency to increase the number of external terminals provided in one semiconductor device. The increase in the number of external terminals leads to the tendency to enlarge a packaging area (i.e., outer size) of a wiring substrate (interposer substrate) on which a semiconductor chip is mounted. On the other hand, owing to the development of processes for forming fine wiring, the increase in external size of the semiconductor chip tends to be suppressed even when the functionality enhancement is advanced. In the case of the semiconductor device having a large packaging area, for example, the wiring substrate is likely to warp due to, for example, the heating process in packaging the semiconductor device. Particularly, when an external size of the semiconductor chip is smaller with respect to an external size of the wiring substrate, it is difficult to suppress the warpage deformation. The studies by the inventor of this application have revealed that, when the warpage described above occurs in a semiconductor device provided with a large number of external terminals, adjacent external terminals are likely to be short-circuited around a corner having the largest amount of displacement on the mounting surface of the wiring substrate.

Other problems and novel features will be apparent from the descriptions in the specification and the accompanying drawings.

A semiconductor device according to an embodiment includes: a wiring substrate; a semiconductor chip mounted on the wiring substrate; and a plurality of solder balls connected to a plurality of bump lands of the wiring substrate, respectively. The wiring substrate includes: a first insulating layer; a first conductive layer having a first conductive pattern, and formed on a first surface of the first insulating layer; a second insulating layer formed on the first surface of the first insulating layer so as to cover the first conductive layer; a second conductive layer having a second conductive pattern, and formed on the second insulating layer; a third conductive layer having a third conductive pattern, and formed on a second surface of the first insulating layer; a third insulating layer formed on the second surface of the first insulating layer so as to cover the third conductive layer; and a fourth conductive layer having a fourth conductive pattern including the plurality of bump lands, and formed on the third insulating layer. A shape of each of the chip mounting surface and the mounting surface is comprised of a quadrangular having a side whose length is 20 mm or more. In plan view, the semiconductor chip is comprised of a quadrangular, an area of the semiconductor chip being less than 10% of an area of the chip mounting surface. Given that an occupancy ratio of the first conductive pattern in the first conductive layer is a first occupancy ratio, an occupancy ratio of the second conductive pattern in the second conductive layer is a second occupancy ratio, an occupancy ratio of the third conductive pattern in the third conductive layer is a third occupancy ratio, and an occupancy ratio of the fourth conductive pattern in the fourth conductive layer is a fourth occupancy ratio, each of the first occupancy ratio and the third occupancy ratio is greater than each of the second occupancy ratio and the fourth occupancy ratio.

According to the embodiment described above, it is possible to improve the performance of the semiconductor device.

DETAILED DESCRIPTION

Figure 1:
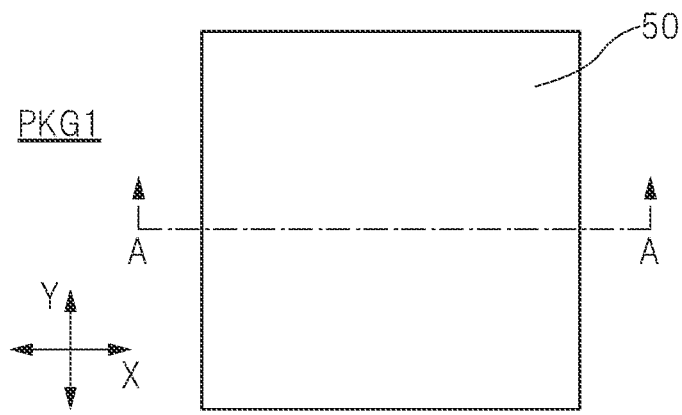
FIG. 1 is a top view of a semiconductor device according to the present embodiment.

Explanation of Description Form, Basic Terminology, and Usage in this Application In this application, the embodiment will be described in a plurality of sections or the like when required as a matter of convenience. However, these sections or the like are not irrelevant to each other unless otherwise stated, and a part of one example relates to the other example as details or a part or the entire of a modification regardless of the order of description. Also, the repetitive description of similar parts will be omitted in principle. Further, the constituent elements in the embodiment are not always indispensable unless otherwise stated or except for the case where the constituent elements are theoretically limited to that number or the constituent elements are obviously indispensable from the context.

Likewise, in the description of the embodiment or the like, the phrase "X made of A" for a material, a composition or the like is not intended to exclude those containing elements other than A unless otherwise specified or except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multi-component alloy containing silicon as a main component, and a member containing other additives or the like. In addition, when mentioning gold plating, a Cu layer, nickel plating or the like, it includes a member containing gold, Cu, nickel, or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiment, the same or similar parts are denoted by the same or similar reference characters or reference numbers, and the descriptions thereof are not repeated in principle.

In addition, in the accompanying drawings, hatching may be omitted even in cross-sections in the case where the hatchings make the drawings complicated on the contrary or discrimination from void is clear. In relation to this, when it is clear from the description or the like, an outline of a background may be omitted even in a planarly closed hole. Furthermore, even in the cases other than the cross-section, hatching or dot pattern may be applied so as to clarify that a portion is not a vacant space or clearly illustrate the boundary between regions.

Furthermore, in the following description, terms such as a ground plane and a power supply plane may be used in some cases. The ground plane and the power supply plane are large-area conductive patterns different in shape from the so-called wiring patterns. Of the large-area conductive patterns, the plane to which the reference potential is supplied is referred to as the ground plane, and the plane to which the power supply potential is supplied is referred to as the power supply plane.

<Semiconductor Device>

Figure 2:
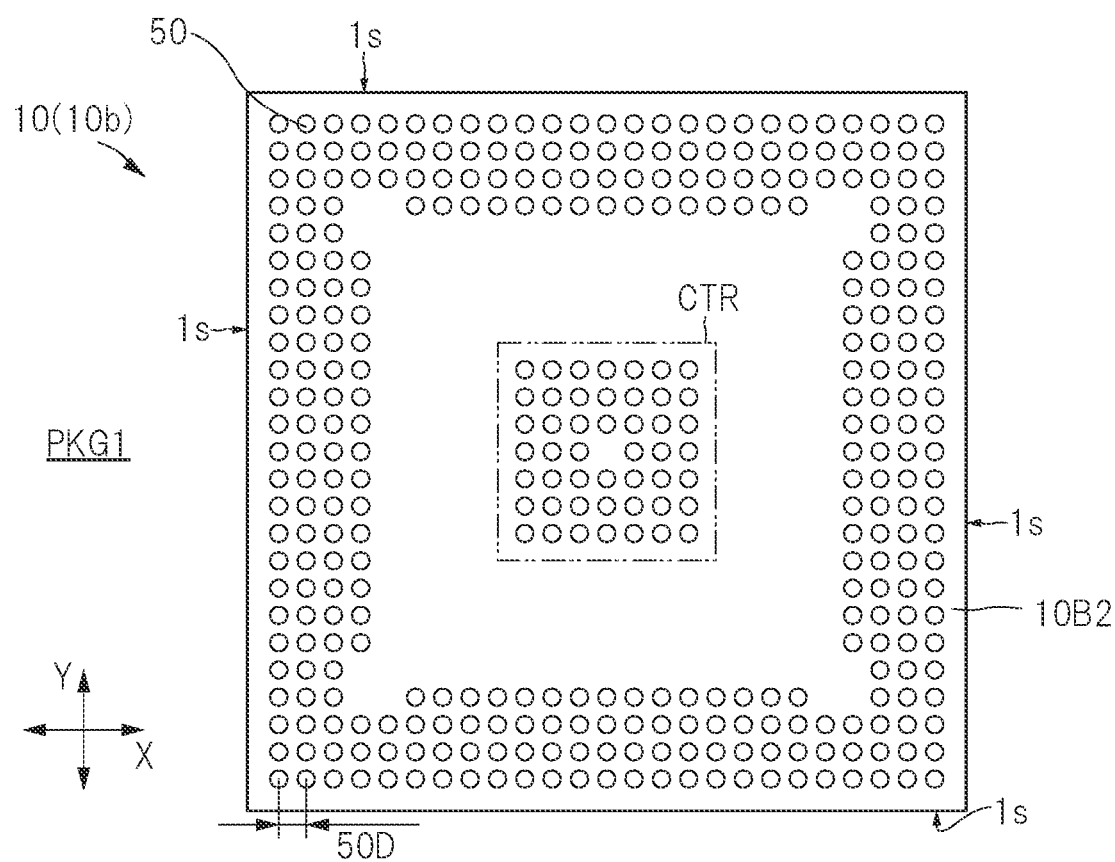
FIG. 2 is a bottom view of the semiconductor device shown in FIG. 1.
Figure 3:
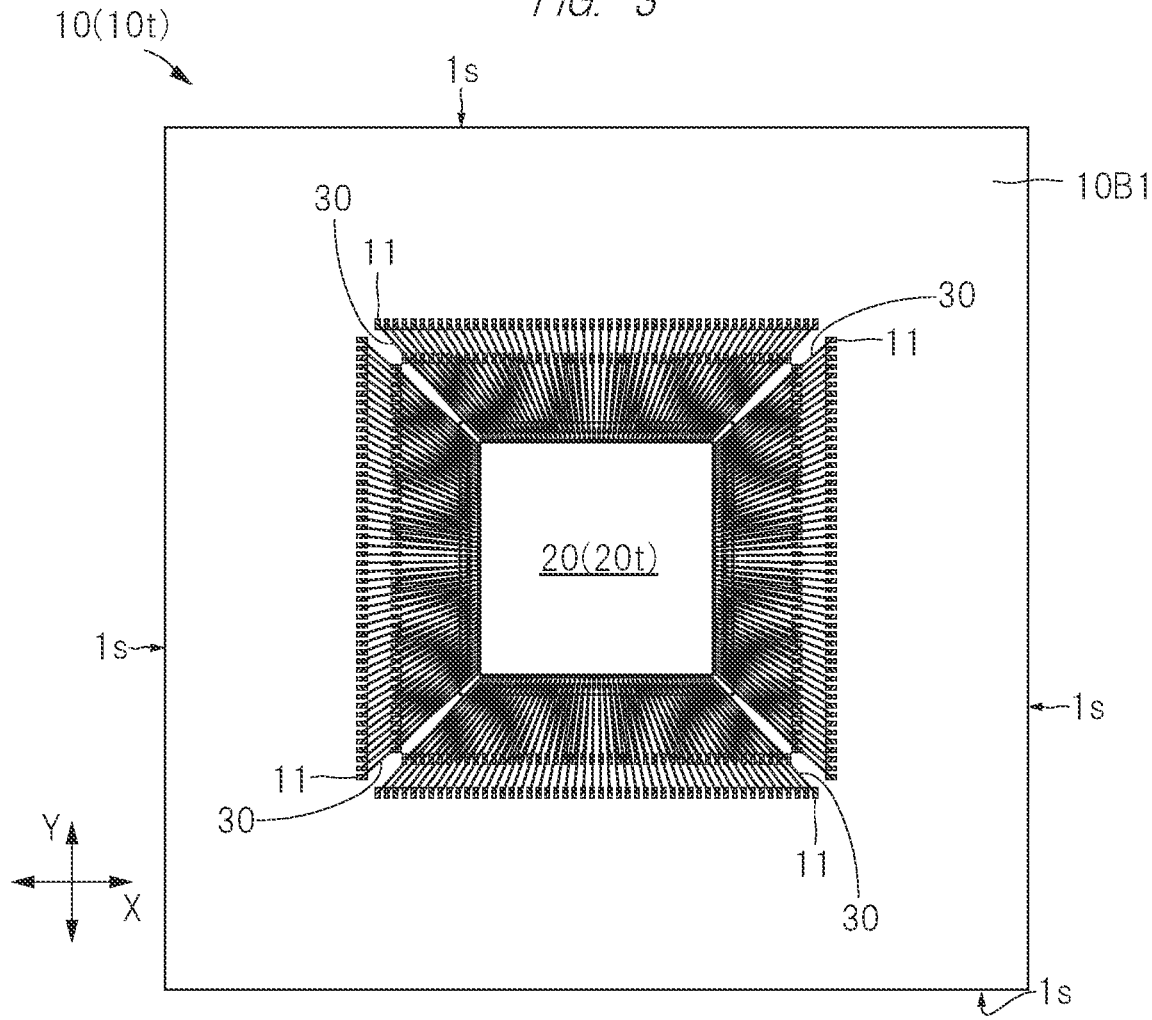
FIG. 3 is a plan view showing the internal structure of the semiconductor device on a wiring substrate in a state where a sealing body shown in FIG. 1 is removed.
Figure 4:
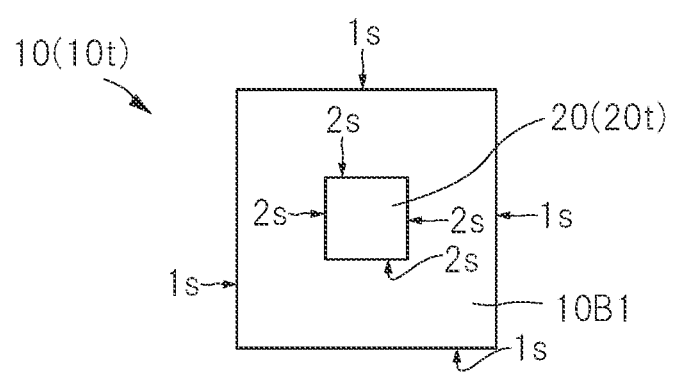
FIG. 4 is a top view of the wiring substrate in a state where a plurality of bonding wires, a plurality of bonding leads, and a plurality of pads of the semiconductor chip shown in FIG. 3 are removed.
Figure 5:
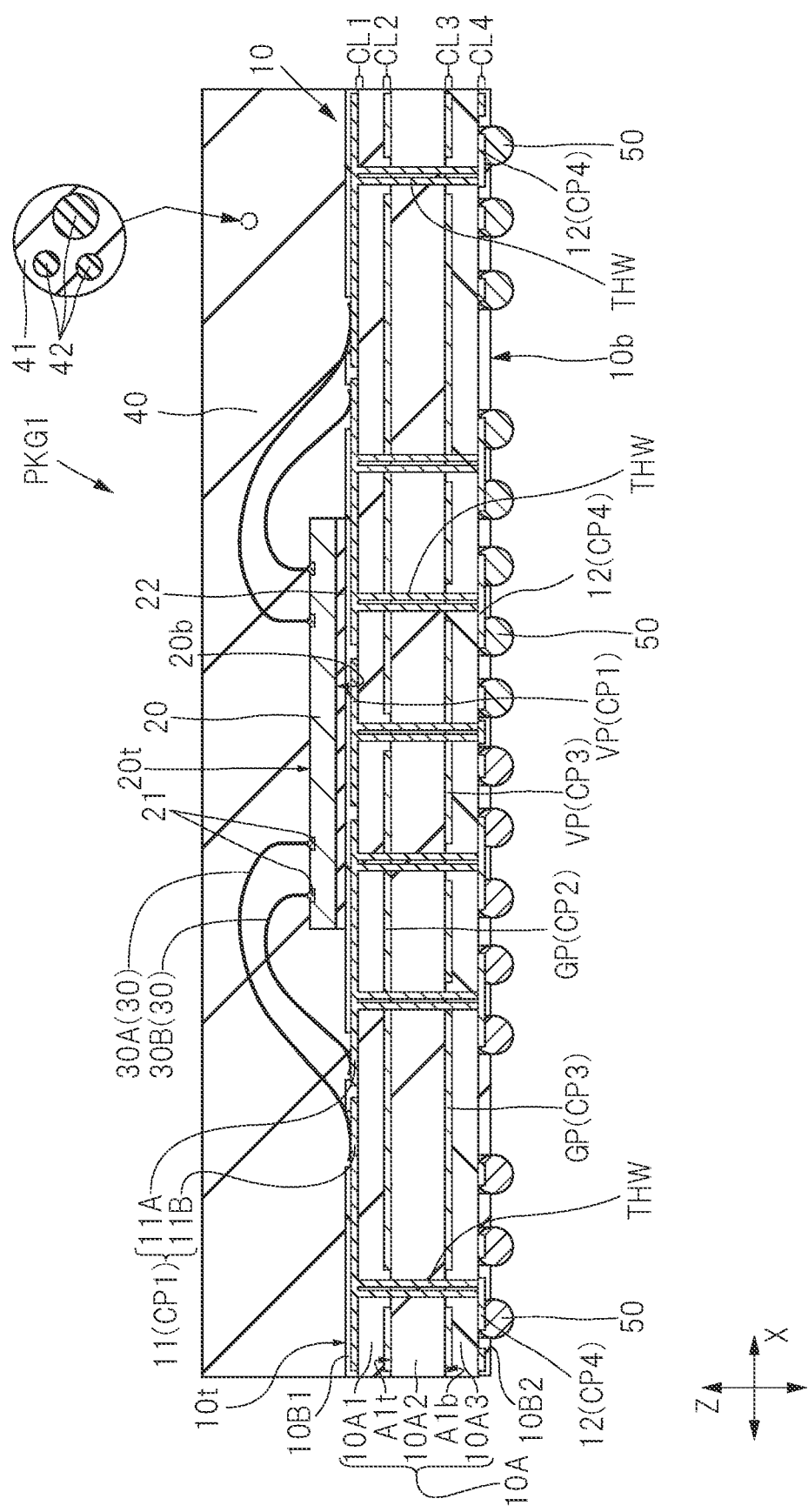
FIG. 5 is a cross-sectional view taken along the line A-A in FIG. 1.

FIG. 1 is a top view of a semiconductor device according to the present embodiment. FIG. 2 is a bottom view of the semiconductor device shown in FIG. 1. Also, FIG. 3 is a plan view showing the internal structure of the semiconductor device on a wiring substrate in a state where a sealing body shown in FIG. 1 is removed. FIG. 4 is a top view of the wiring substrate in a state where a plurality of bonding wires, a plurality of bonding leads, and a plurality of pads of the semiconductor chip shown in FIG. 3 are removed. Further, FIG. 5 is a cross-sectional view taken along the line A-A in FIG. 1. Moreover, FIG. 5 is a cross-sectional view of a semiconductor device PKG1 similar to FIG. 2, but the number of terminals (the number of solder balls 50) is reduced in FIG. 5 for ease of viewing.

The semiconductor device PKG1 according to the present embodiment includes a wiring substrate 10, a semiconductor chip mounted on a top surface (chip mounting surface) 10t of the wiring substrate 10 (see FIG. 3), a plurality of bonding wires electrically connecting the semiconductor chip 20 and the wiring substrate 10 (see FIG. 3), a sealing body 40 that seals the semiconductor chip 20 and the plurality of bonding wires 30 (see FIG. 1), and a plurality of solder balls 50 (see FIG. 2) arranged on a bottom surface (mounting surface) 10b of the wiring substrate 10 (see FIG. 2).

A plurality of bonding leads 11 is arranged on the top surface 10t of the wiring substrate 10. In addition, the plurality of solder balls 50 shown in FIG. 2 is bonded to a plurality of bump lands 12 shown in FIG. 5, respectively.

As shown in FIG. 5, the wiring substrate 10 has the top surface (surface, main surface, chip mounting surface, first main surface) 10t on which the semiconductor chip 20 is mounted, and the bottom surface (surface, main surface, mounting surface, second main surface) 10b on the opposite side of the top surface 10t. In the present embodiment, the wiring substrate 10 has a quadrangular outer shape with four sides 1s as shown in FIG. 2 and FIG. 3. These four sides 1s intersect each other. Each side 1s has a length ranging from 20 to 30 mm. Moreover, in the present embodiment, the wiring substrate 10 having a square outer shape is described as an example, but the wiring substrate 10 may have a rectangular planar shape as a modification. In this case, some of the four sides 1s may be shorter than 20 mm, but the area (planar area) of the wiring substrate is 400 to 900 mm² like the wiring substrate 10.

The wiring substrate 10 includes a plurality of conductive layers CL1, CL2, CL3, and CL4 for electrically connecting terminals (bonding leads 11) on the top surface 10t which is the chip mounting surface and terminals (solder balls 50) on the bottom surface 10b which is the mounting surface. Each conductive layer is positioned between the top surface 10t and the bottom surface 10b. The conductive layers have respective conductive patterns such as wirings, which are paths for supplying electrical signals and power. The conductive layer CL1 has a plurality of conductive patterns CP1 including the plurality of bonding leads 11. The conductive layer CL2 has a conductive pattern CP2 including one or more ground planes or power supply planes. The conductive layer CL3 has a conductive pattern CP3 including one or more ground planes or power supply planes. The conductive layer CL4 has a plurality of conductive patterns CP4 including the plurality of bump lands 12.

Further, insulating layers 10A are arranged between the conductive layers. The wiring substrate 10 includes an insulating layer 10A2 having a top surface Alt and a bottom surface Alb on the opposite side of the top surface Alt, an insulating layer 10A1 formed on the top surface Alt of the insulating layer 10A2 so as to cover the conductive layer CL2, and an insulating layer 10A3 formed on the bottom surface Alb of the insulating layer 10A2 so as to cover the conductive layer CL3. Moreover, in the present embodiment, the insulating layer 10A2 is thicker than each of the insulating layers 10A1 and 10A3 as shown in FIG. 5. However, as a modification of the wiring substrate 10, a wiring substrate in which the respective insulating layers have the same thickness (that is, a wiring substrate without a core layer) may be employed.

In the present embodiment, each of the insulating layer 10A2, the insulating layer 10A1, and the insulating layer 10A3 is made of a prepreg material containing glass fiber and epoxy resin impregnated in the glass fiber. It is possible to suppress the deformation of the wiring substrate 10 by using the prepreg material to form the insulating layers 10A. Moreover, as a modification of the present embodiment, the insulating layer 10A1 and the insulating layer 10A3 may be made of a resin that does not contain glass fiber. Even in such a case, the deformation of the wiring substrate 10 can be suppressed if the insulating layer 10A2 is made of the prepreg material. However, it is particularly preferable that all the insulating layers 10A in three layers contain glass fiber in order to improve the effect of suppressing the deformation of the wiring substrate 10.

Further, the wiring substrate 10 is provided with the conductive layer CL1 which has the conductive pattern CP1 including the plurality of bonding leads 11 and is formed on the insulating layer 10A1, and the conductive layer CL2 which has the conductive pattern CP2 and is formed on the top surface Alt of the insulating layer 10A2. The wiring substrate 10 is provided with the conductive layer CL3 which has the conductive pattern CP3 and is formed on the bottom surface Alb of the insulating layer 10A2, and the conductive layer CL4 which has the conductive pattern CP4 including the plurality of bump lands 12 and is formed on the insulating layer 10A3. The plurality of bonding leads 11 and the plurality of bump lands 12 are electrically connected via through-hole wirings THW formed in through holes penetrating the plurality of insulating layers 10A in the thickness direction. In the present embodiment, each of the conductive patterns CP2 and CP3 is used as a large-area conductive pattern (conductor plane) for supplying a fixed potential such as a reference potential or a power supply potential. Therefore, the conductive pattern CP2 is electrically connected to the bump land 12 and the bonding lead 11 via the through-hole wiring THW. Similarly, the conductive pattern CP3 is electrically connected to the bump land 12 and the bonding lead 11 via the through-hole wiring THW.

Further, the wiring substrate 10 is provided with an insulating film 10B1 formed on the insulating layer 10A1 so as to expose each of the plurality of bonding leads 11 and an insulating film 10B2 formed on the insulating layer 10A3 so as to expose each of the plurality of bump lands 12. Each of the insulating films 10B1 and 10B2 is a solder resist film made of a resin material capable of preventing solder bridging. In the present embodiment, each of the insulating films 10B1 and 10B2 which is a solder resist film is made of a resin containing no glass fiber. Namely, each of the insulating films 10B1 and 10B2 is not at least a prepreg material.

Further, the semiconductor device PKG1 includes the semiconductor chip 20 mounted on the wiring substrate 10. As shown in FIG. 5, the semiconductor chip 20 has a top surface (main surface, front surface) 20t and a bottom surface (main surface, back surface) 20b on the opposite side of the top surface 20t. In addition, the semiconductor chip 20 is a quadrangular with four sides 2s in plan view. The semiconductor chip 20 has a quadrangular outer shape with a planar area smaller than the wiring substrate 10 in plan view as shown in FIG. 4. In the example shown in FIG. 3, the semiconductor chip 20 is mounted in the central region of the top surface 10t of the wiring substrate 10, and the four sides 2s of the semiconductor chip 20 extend along the four sides is of the wiring substrate 10, respectively. As shown in FIG. 4, the semiconductor chip 20 is a quadrangular with an area of less than 10% (excluding 0%) of the area of the top surface 10t of the wiring substrate 10 in plan view. In addition, as shown in FIG. 4, the semiconductor chip 20 is mounted in a central region including the center of the top surface 10t of the wiring substrate 10 in plan view.

The semiconductor chip 20 has a thickness smaller than that of the wiring substrate 10. For example, in the example shown in FIG. 5, the semiconductor chip 20 has a thickness of approximately 270 to 290 μm. On the other hand, each of the insulating layers 10A1 and 10A3 has a thickness of approximately to 50 μm, and the insulating layer 10A2 has a thickness of approximately 300 to 400 μm. The total thickness of the wiring substrate 10 is approximately 500 to 600 μm. Moreover, the sealing body 40 has a thickness of approximately 700 to 900 μm.

Further, a plurality of electrodes (pads, electrode pads, bonding pads) 21 is formed on the top surface 20t of the semiconductor chip 20. In the example shown in FIG. 5, the semiconductor chip 20 is mounted on the wiring substrate 10 with the bottom surface 20b facing the top surface 10t of the wiring substrate 10. The semiconductor chip 20 is adhered and fixed on the top surface 10t of the wiring substrate 10 via an adhesive layer 22. The mounting method like this is referred to as a face-up mounting method. When mounting the semiconductor chip on the wiring substrate 10 by the face-up mounting method, a double-sided adhesive film called a die attach film (DAF) or a paste adhesive can be employed as the adhesive layer 22.

Although not shown, a plurality of semiconductor elements (circuit elements) is formed on the main surface of the semiconductor chip 20 (more specifically, a semiconductor element formation region provided on an element formation surface of the semiconductor substrate that is the base material of the semiconductor chip 20). The plurality of electrodes 21 is electrically connected to the plurality of semiconductor elements via wiring (not shown) formed in a conductive layer arranged inside the semiconductor chip 20 (more specifically, between the top surface 20t and the semiconductor element formation region (not shown)).

The semiconductor substrate provided in the semiconductor chip 20 is made of, for example, single crystal silicon (Si). In addition, an insulating film covering the base material and wiring of the semiconductor chip 20 is formed on the top surface 20t, and a part of each of the plurality of electrodes 21 is exposed from the insulating film through an opening formed in the insulating film. In addition, each of the plurality of electrodes 21 is made of metal, for example, aluminum (Al) in the present embodiment.

As shown in FIG. 5, the sealing body 40 is formed on the top surface 10*t* of the wiring substrate 10. The sealing body 40 is formed so as to cover the entire top surface 10*t* of the wiring substrate 10, and seals the semiconductor chip 20 and the plurality of bonding wires 30. In addition, the insulating film 10B1 having the top surface 10*t* of the wiring substrate 10 is in close contact with the sealing body 40. The sealing body 40 covers the top surface 10*t* of the wiring substrate 10 such that the insulating film 10B1 is not exposed. By sealing the bonding wires 30 with the sealing body 40, it is possible to suppress the deformation of the bonding wires 30. The deformation of the bonding wires 30 may cause the short-circuit between the adjacent bonding wires 30. However, by sealing the entirety of the plurality of bonding wires 30 with the sealing body 40 made of an insulating resin, it is possible to avoid the short-circuit between the bonding wires 30. It is sufficient that the sealing body 40 is made of an insulating material from the viewpoint of preventing the short-circuit between the bonding wires 30. However, from the viewpoint of improving the adhesion between the semiconductor chip 20 and the sealing body 40, it is preferable that the sealing body 40 and the semiconductor chip have linear expansion coefficients close to each other. Thus, the sealing body 40 of the present embodiment includes a resin body 41 containing a thermosetting resin and a plurality of inorganic filler particles 42 contained in resin body 41.

As shown in FIG. 5, the electrodes 21 formed on the top surface 20*t* of the semiconductor chip 20 and the bonding leads 11 exposed from the insulating film 10B1 of the wiring substrate are electrically connected via the bonding wires 30. One end of the bonding wire 30 is bonded to the electrode 21, and the other end of the bonding wire 30 is bonded to the bonding lead 11. Each of the plurality of bonding wires 30 is made of, for example, gold (Au) or copper (Cu). As shown in FIG. 3, in the case of the semiconductor device PKG1 according to the present embodiment, since there are a large number of terminals, the bonding leads 11 are arranged in a plurality of rows (two rows in FIG. 3) along each of the four sides is of the wiring substrate 10. In the case of the present embodiment, in order to prevent the short-circuit between the plurality of bonding wires 30, the wire loop of the bonding wires 30B connected to the bonding leads 11A arranged on an inner side (the side closer to the semiconductor chip 20) has a peak height lower than that of the wire loop of the bonding wires 30A connected to the bonding leads 11B arranged on an outer side (the side farther from the semiconductor chip 20) as shown in FIG. 5.

Further, each of the plurality of solder balls 50 is a conductive member that electrically connects a plurality of terminals (not shown) on a motherboard and the plurality of bump lands 12 when packaging the semiconductor device PKG1 on the motherboard (not shown). The solder ball 50 is, for example, an Sn—Pb solder material containing lead (Pb) or a solder material made of so-called lead-free solder that contains substantially no Pb. Examples of the lead-free solder include tin (Sn) only, tin-bismuth (Sn—Bi), tin-copper-silver (Sn—Cu—Ag), tin-copper (Sn—Cu), and the like. The lead-free solder mentioned here means solder containing 0.1 wt % or less of lead (Pb), and the content is defined as a standard of the restriction of hazardous substances (RoHS) directive.

Further, the plurality of solder balls 50 is arranged in rows and columns (array, matrix) as shown in FIG. 2. In addition, although not shown in FIG. 2, the plurality of bump lands 12 (see FIG. 5) to which the plurality of solder balls 50 is bonded is also arranged in rows and columns (matrix). The semiconductor device in which a plurality of external terminals (solder balls 50, bump lands 12) is arranged in rows and columns on the side of the mounting surface of the wiring substrate 10 as described above is referred to as an area-array semiconductor device. Since the area-array semiconductor device can efficiently utilize the mounting surface (bottom surface 10*b*) of the wiring substrate 10 as an arrangement space for the external terminals, this type of semiconductor device is advantageous in that it is possible to suppress the increase in the mounting area of the semiconductor device even when the number of external terminals increase. In other words, even a semiconductor device in which the number of external terminals increases with higher functionality and integration can be mounted in a space-saving manner.

In the example shown in FIG. 5, side surfaces of the plurality of bump lands 12 are bonded to the solder balls 50. The bonding method like this is referred to as a non-solder mask defined (NSMD) type. However, as a modification of FIG. 5, a solder mask defined (SMD) type in which the side surface of the bump land 12 is covered with the insulating film 10B2 may be employed. Even when the SMD type is employed, the pitch of the SMD solder balls 50 (i.e., the bump lands 12) is the same as the pitch of the NSMD solder balls 50 (i.e., the bump lands 12). In the case of the SMD type, the side surface of the bump land 12 is not bonded to the solder ball 50. Thus, from the viewpoint of improving the bonding strength between the solder ball 50 and the bump land 12, the NSMD type is preferable.

<Warpage Deformation in Wiring Substrate>

Figure 6:
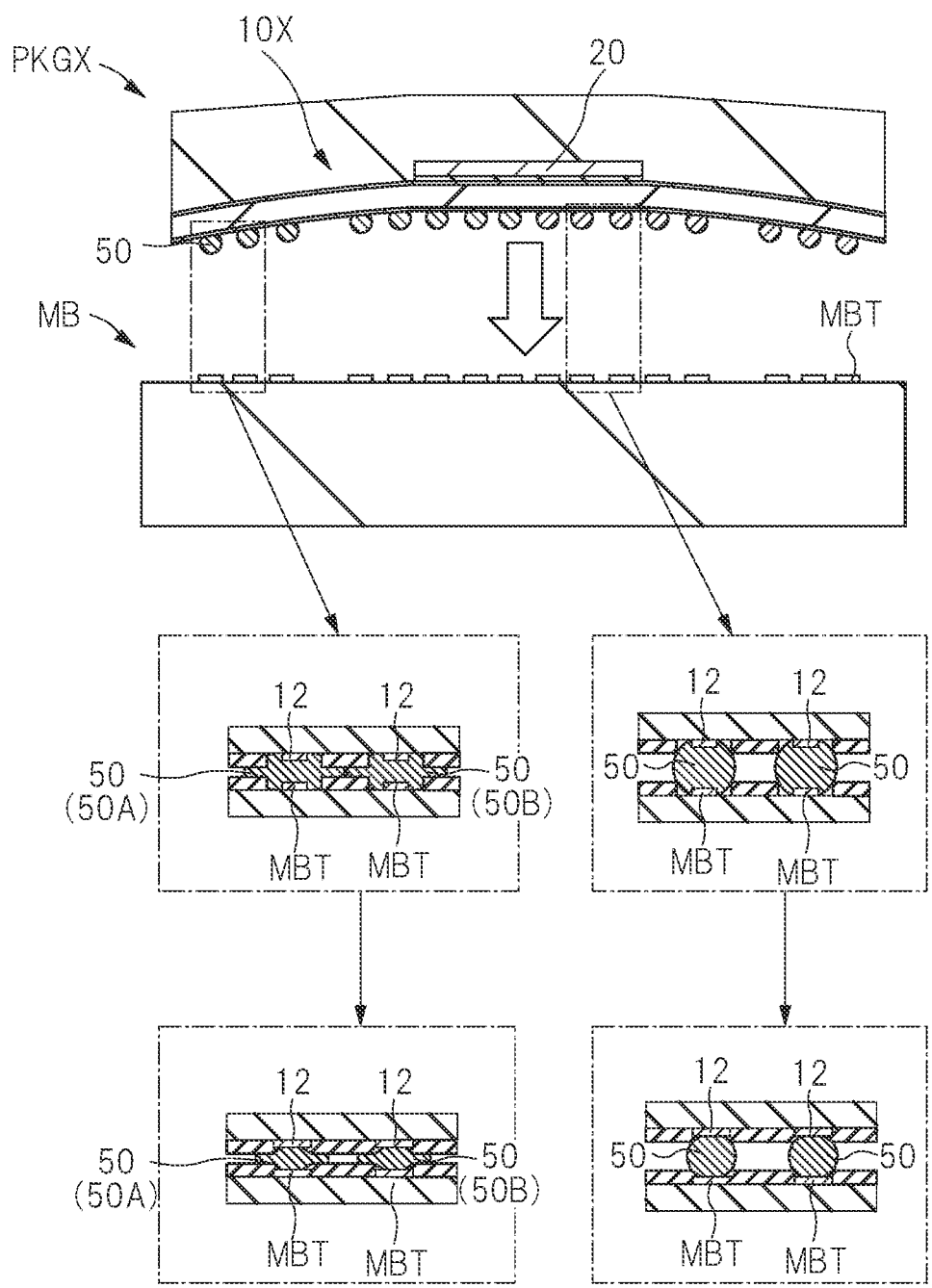
FIG. 6 is a cross-sectional view schematically showing a state of a deformed semiconductor device.

Next, the conditions under which the warpage deformation is likely to occur in the wiring substrate, problems caused by the deformation of the wiring substrate, and measures against the deformation of the wiring substrate will be described in order. FIG. 6 is a cross-sectional view schematically showing a deformed semiconductor device. Moreover, in FIG. 6, as an example of the bonding method of the solder balls 50, the case of the NSMD type is illustrated in the upper part and the case of the SMD type as a modification is illustrated in the lower part.

As described above, the recent advancement in the functionality of semiconductor devices has led to the tendency to increase the number of external terminals provided in one semiconductor device. The increase in the number of external terminals leads to the tendency to enlarge the outer size of a wiring substrate on which a semiconductor chip is mounted. On the other hand, owing to the development of processes for forming fine wiring, the increase in external size of a semiconductor chip tends to be suppressed even when the functionality enhancement is advanced. In addition, in the case of a semiconductor device in which a semiconductor chip and a wiring substrate are electrically connected via a bonding wire, cost reduction is particularly required. Thus, the number of conductive layers provided in the wiring substrate is preferably small. In one example, regarding the number of conductive layers, a semiconductor device PKGX shown in FIG. 6 has a two-layer structure in which a conductive layer is formed on each of the top surface and the bottom surface.

However, the studies by the inventor of this application have revealed that the problem of warpage deformation in the wiring substrate is caused as the size of the wiring substrate increases and the size of the semiconductor chip decreases. As shown in FIG. 6, in the case of the semiconductor device PKGX having a large external size, the warpage deformation is likely to occur in a wiring substrate 10X due to the heating process in the manufacturing and packaging process of the semiconductor device PKGX. As a result, when packaging the semiconductor device PKGX on a mounting board (motherboard) MB on which a plurality of terminals MBT is arranged, some adjacent solder balls among the plurality of solder balls 50 may be short-circuited in some cases. In other words, some of the plurality of terminals MBT may be bridged through the solder balls 50 in some cases.

As shown in FIG. 6, the warpage deformation is unlikely to occur in the region of the wiring substrate 10X directly under the semiconductor chip 20 because the rigid semiconductor chip is attached thereto. Thus, in the region directly under the semiconductor chip 20, one solder ball 50 is bonded to one terminal MBT. On the other hand, in the peripheral portion far from the semiconductor chip 20, the warpage deformation occurs in the wiring substrate 10X due to the heating process in the manufacturing and packaging process of the semiconductor device PKGX, and thus the solder balls 50 are deformed (crushed in the example shown in FIG. 6). As a result, among the plurality of solder balls 50 arranged on the mounting surface of the wiring substrate 10X, the distance between a solder ball 50A in the outermost periphery and a solder ball 50B located next to the solder ball 50A decreases, resulting in short-circuit.

The short-circuit between the plurality of solder balls 50 is noticeable in the case where the NSMD type shown in the upper part of FIG. 6 is employed as the bonding method of the solder ball 50 in comparison with the case where the SMD type shown in the lower part of FIG. 6 is employed. In the case of the NSMD type, the solder ball 50 needs to be bonded to the side surface of the bump land 12 and the side surface of the terminal MBT as shown in FIG. 6, so the amount of solder is larger as compared with the SMD type. Thus, the spread amount (crushed amount) of the solder ball in the horizontal direction (direction parallel to the top surface of the wiring substrate) when the solder ball 50 is deformed is larger in the NSMD type than in the SMD type. As described above, the pitch between adjacent solder balls 50 is the same in both the SMD and NSMD types. Thus, the adjacent solder balls 50 are more likely to be short-circuited in the NSMD type which uses a relatively larger amount of solder than in the SMD type.

A semiconductor device like the semiconductor device PKGX shown in FIG. 6 in which the warpage deformation large enough to cause the short-circuit is likely to occur has the following features. First, in the case where the wiring substrate 10X has a quadrangular planar shape and the length of each side is 20 mm or more, the influence of warpage deformation is likely to occur. In addition, the warpage deformation is particularly likely to occur in the case where the length of each side is 25 mm or more. In addition, the warpage deformation is likely to occur in the case where the semiconductor chip 20 has an area (planar area) of less than 10% of the chip mounting surface of the wiring substrate 10X. If the area of the semiconductor chip 20 is 10% or more of the area of the chip mounting surface, the deformation of the wiring substrate 10X can be suppressed owing to the rigidity of the semiconductor chip 20. In addition, the warpage deformation is likely to occur in the case where the number of conductive layers is two or less as in the wiring substrate 10X. The studies by the inventor of this application have revealed that, in the case of the two-layer structure, the degree of warpage deformation is large even when a prepreg material containing glass fiber is used as an insulating layer. In addition, it has been found that the degree of warpage deformation is large in the case where the insulating layer made of the prepreg material is formed to have a thickness equal to or larger than the thicknesses of the insulating layer 10A1, the insulating layer 10A2, and the insulating layer 10A3 shown in FIG. 5 (e.g., 0.4 to 0.5 mm).

Further, although the array pitch of the plurality of solder balls 50 does not directly affect the degree of warpage deformation, it gives a large influence from the viewpoint of prevention of short-circuit. In FIG. 2, for example, a center-to-center distance 50D between the adjacent solder balls 50 among the plurality of solder balls 50 is 800 μm or less (excluding 0 μm).

Based on the above, the inventor of this application has studied the measures for preventing short-circuit and the measures for preventing warpage deformation. As a result, it has been found that it is most effective to suppress the warpage deformation of the wiring substrate by providing four conductive layers in the wiring substrate as described below. The conductive layer CL1, the conductive layer CL2, the conductive layer CL3, and the conductive layer CL4 shown in FIG. 5 each have a conductive pattern. Each of the conductive patterns is made of, for example, copper or copper alloy containing copper as a main component. According to the experimental evaluation results obtained by the inventor of this application, it has been found that it is possible to reduce the degree of warpage deformation of the wiring substrate 10 by making the wiring substrate 10 have four conductive layers and satisfying the following conditions in the case of the semiconductor device PKG1 shown in FIG. 1 to FIG. 5.

More specifically, in the case of the semiconductor device PKG1 according to the present embodiment, the occupancy ratio of the conductive pattern CP2 in the conductive layer CL2 shown in FIG. 5 is given as a first occupancy ratio, the occupancy ratio of the conductive pattern CP1 in the conductive layer CL1 is given as a second occupancy ratio, the occupancy ratio of the conductive pattern CP3 in the conductive layer CL3 is given as a third occupancy ratio, and the occupancy ratio of the conductive pattern CP4 in the conductive layer CL4 is given as a fourth occupancy ratio. In such a case, each of the first occupancy ratio and the third occupancy ratio is greater than each of the second occupancy ratio and the fourth occupancy ratio. The occupancy ratio herein means the occupancy ratio of the area of the conductive patterns in each conductive layer including the conductive pattern and the space between the conductive patterns. For example, in the case shown in FIG. 7 described later, the plurality of conductive patterns CP1 formed in the conductive layer CL1 includes the bonding leads 11, the wiring 13, a through-hole land 14, a power supply line 15, a power supply plane VP, and a ground plane GP. The second occupancy ratio of the conductive layer CL1 is calculated as a value obtained by dividing the total area of the conductive patterns CP1 by the area of the top surface Alt of the insulating layer 10A2. Each of the conductive patterns CP1 to CP4 is made of a metal material such as copper. According to the studies by the inventor of this application, it is conceivable that the deformation of the wiring substrate 10 can be suppressed owing to the resistance against bending deformation of the conductive pattern made of metal. The description will be given below with reference to FIG. 7 to FIG. 10.

Figure 7:
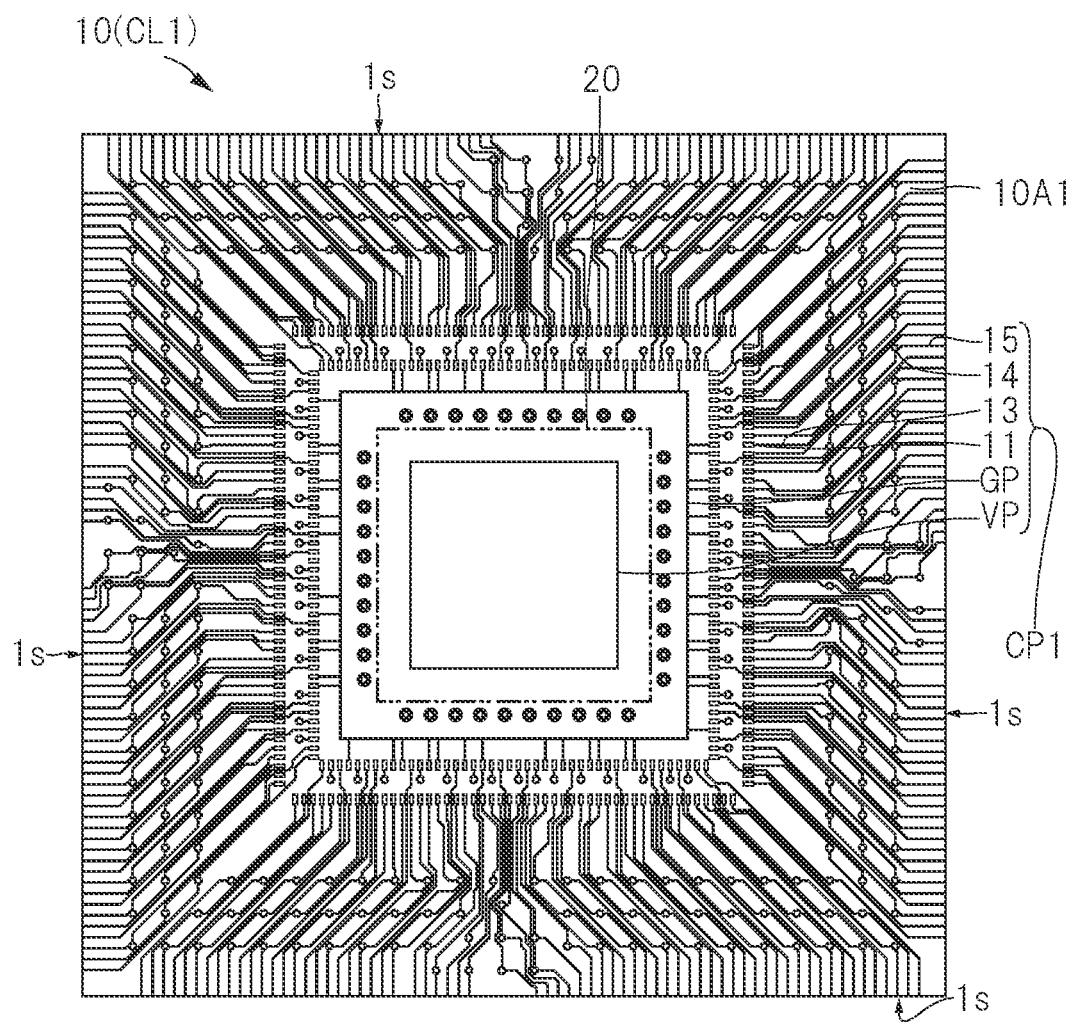
FIG. 7 is a plan view showing a planar layout of a conductive layer in the first (uppermost) layer among the four conductive layers shown in FIG. 5.
Figure 8:
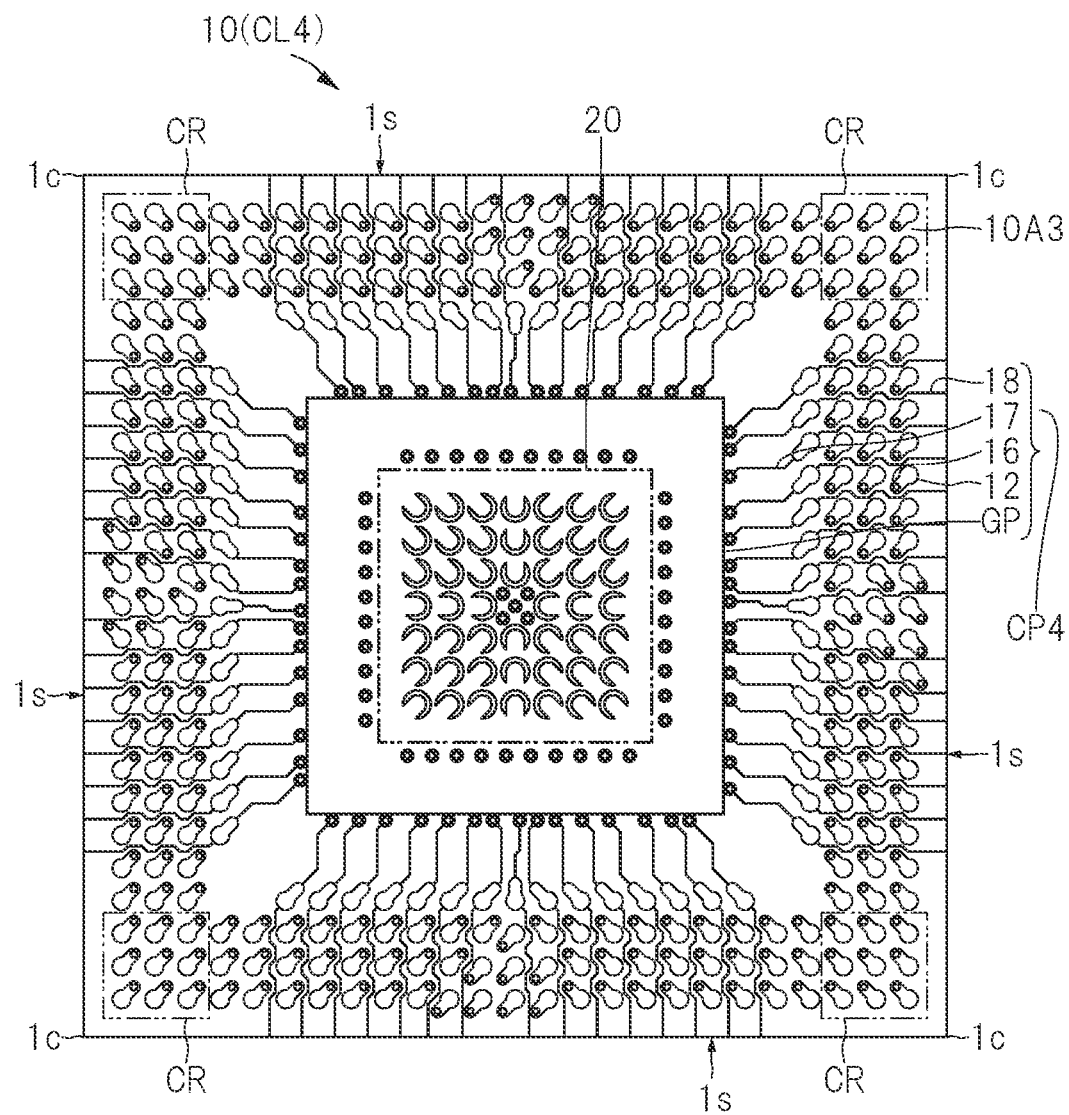
FIG. 8 is a plan view showing a planar layout of a conductive layer in the fourth (lowermost) layer among the four conductive layers shown in FIG. 5.
Figure 9:
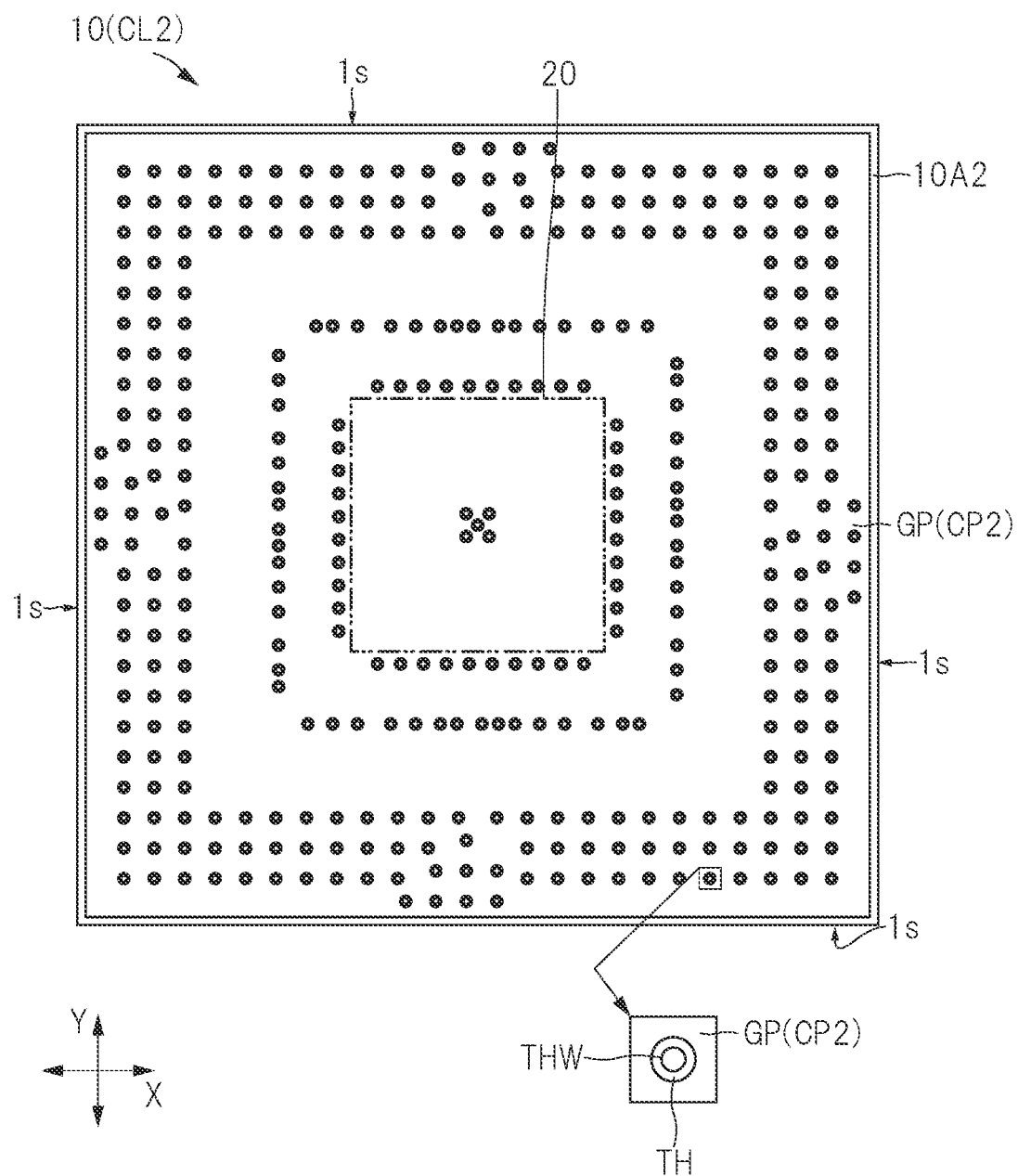
FIG. 9 is a plan view showing a planar layout of a conductive layer in the second layer (immediately below the first layer) among the four conductive layers shown in FIG. 5.
Figure 10:
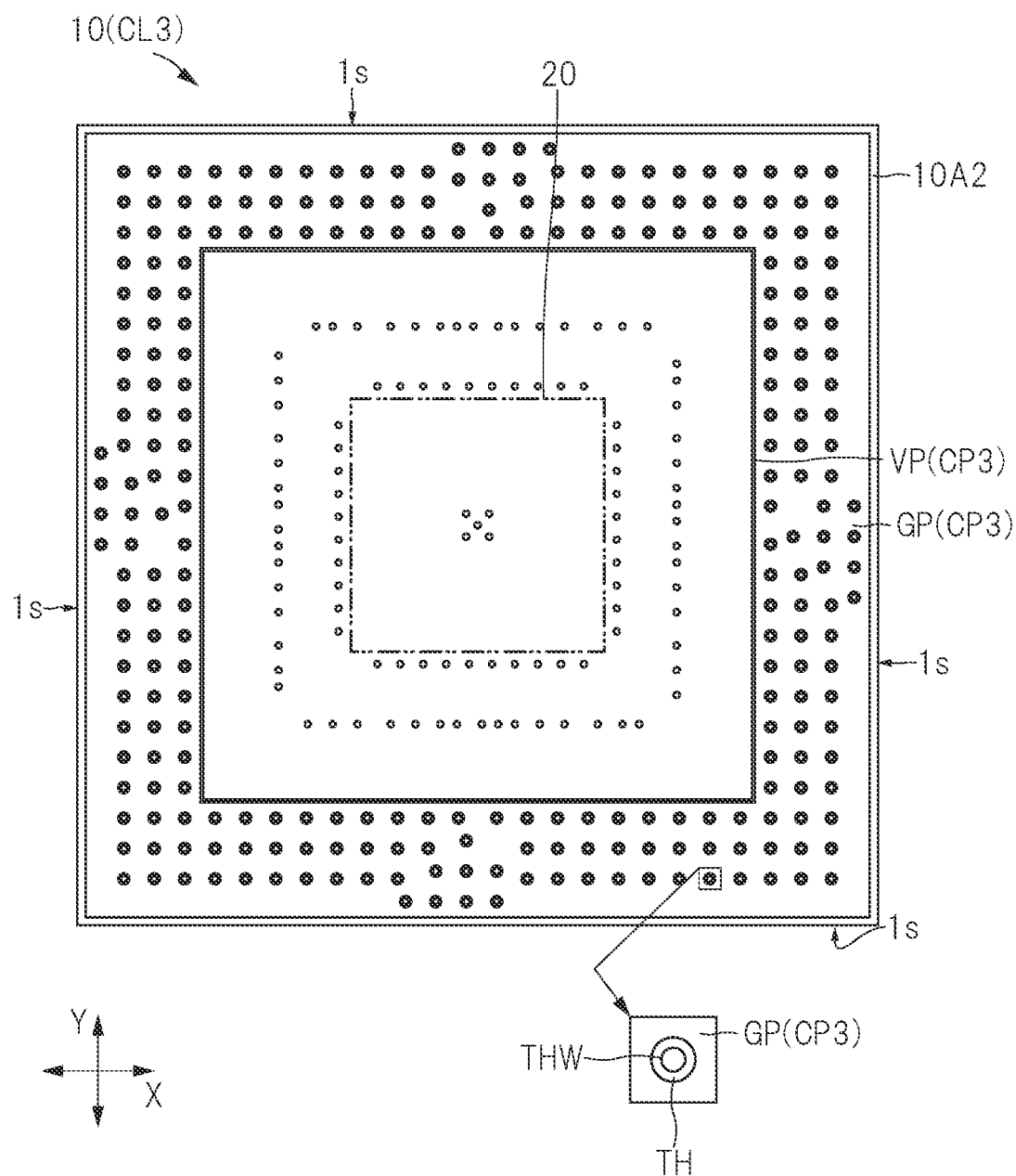
FIG. 10 is a plan view showing a planar layout of a conductive layer in the third layer (immediately below the second layer) among the four conductive layers shown in FIG. 5.

FIG. 7 is a plan view showing a planar layout of a conductive layer in the first (uppermost) layer among the four conductive layers shown in FIG. 5. FIG. 8 is a plan view showing a planar layout of a conductive layer in the fourth (lowermost) layer among the four conductive layers shown in FIG. 5. FIG. 9 is a plan view showing a planar layout of a conductive layer in the second layer (immediately below the first layer) among the four conductive layers shown in FIG. 5. FIG. 10 is a plan view showing a planar layout of a conductive layer in the third layer (immediately below the second layer) among the four conductive layers shown in FIG. 5. In FIG. 7 to FIG. 10, the outline of the semiconductor chip shown in FIG. 3 is indicated by a dashed double-dotted line.

In FIG. 7, the plurality of conductive patterns CP1 formed in the conductive layer CL1 includes the plurality of bonding leads 11, the wirings (lead-out wirings) 13 connected to the bonding leads 11, the through-hole lands 14 to which the wirings 13 are connected, and the power supply lines 15 connected to the through-hole lands 14. In addition, in the example shown in FIG. 7, the conductive pattern CP1 includes the ground plane GP which is a large-area conductive pattern connected to the supply path of the reference potential and the power supply plane VP which is a large-area conductive pattern connected to the power supply potential.

The bonding lead 11, the wiring 13, the through-hole land 14, and the electric supply line 15 are integrally formed. The power supply line 15 is a current path used when patterning the bonding lead 11, the wiring 13, and the through-hole land 14 by electroplating method in the manufacturing process of the semiconductor device PKG1. One end of the wiring 13 is connected to the bonding lead 11 and the other end is connected to the through-hole land 14. Each of the plurality of through-hole lands 14 is connected to the through-hole wiring THW shown in FIG. 5.

In the case of the present embodiment, a lead-out wiring used to adjust the planar positional relationship between the bonding lead 11 and the bump land 12 (see FIG. 5) is mainly formed in the conductive layer CL1. In addition, since different electrical signals are transmitted to each of the wirings, the wirings 13 are arranged apart from each other in order to prevent mutual interference of the signals. Thus, it is not possible to extremely increase the second occupancy ratio which is the occupancy ratio of the conductive pattern CP1 in the conductive layer CL1. In the case of the present embodiment, the second occupancy ratio is less than 60% (e.g., approximately 35 to 45%).

Next, in FIG. 8, the plurality of conductive patterns CP4 formed in the conductive layer CL4 includes the plurality of bump lands 12, through-hole lands 16 connected to the bump lands 12, wirings 17 electrically connected to the bump lands 12 and the through-hole lands 16, and power supply lines 18 connected to some of the plurality of bump lands 12. In addition, in the example shown in FIG. 8, the conductive pattern CP4 is a large-area conductive pattern connected to the supply path of the reference potential and includes the ground plane GP integrally formed with the plurality of bump lands 12.

The bump land 12 and the through-hole land 16 are integrally formed in some of the plurality of conductive patterns CP4. Also, the bump land 12, the through-hole land 16, the wiring 17, and the power supply line 18 are integrally formed in others of the plurality of conductive patterns CP4. The power supply line 18 is a current path used when patterning the bump land 12, the through-hole land 16, the wiring 17, and some of the plurality of through-hole lands 14 shown in FIG. 7 by the electroplating method in the manufacturing process of the semiconductor device PKG1. One end of the wiring 17 is connected to the bump land 12 and the other end is connected to the through-hole land 16. Each of the plurality of through-hole lands 16 is connected to the through-hole wiring THW shown in FIG. 5.

The plurality of through-hole lands 14 shown in FIG. 7 and the plurality of through-hole lands 16 shown in FIG. 8 are connected via the plurality of through-hole wirings THW shown in FIG. 9 and FIG. 10. As shown in FIG. 9 and FIG. 10, a plurality of openings (through holes) TH is formed in the conductive pattern CP2 and the conductive pattern CP3. Each of the plurality of through-hole wirings THW is formed to penetrate through the opening TH of the conductive pattern CP2 and the opening TH of the conductive pattern CP3.

In the case of the lowermost conductive layer CL4 in which the plurality of bump lands 12 is formed, the plurality of bump lands 12 constituting the signal transmission path needs to be arranged apart from each other. Therefore, the fourth occupancy ratio, which is the occupancy ratio of the conductive pattern CP4 in the conductive layer CL4, cannot be made extremely large though it can be made larger than the second occupancy ratio. In the case of the present embodiment, the fourth occupancy ratio is less than 60% (e.g., approximately 50 to 59%).

In the case of the semiconductor device PKG1 according to the present embodiment, the wiring paths necessary for operating the circuits provided in the semiconductor device PKG1 can be sufficiently formed in the conductive layers CL1 and CL4 can function sufficiently. However, in the case of the semiconductor device PKG1, the conductive layer CL2 and the conductive layer CL3 are additionally provided for the purpose of suppressing the warpage deformation described above. Thus, if the conductive layer CL2 and the conductive layer CL3 shown in FIG. 5 have openings (through holes) through which the through-hole wiring THW passes, it is possible to arrange large-area conductive patterns around these openings.

For example, in FIG. 9, the conductive pattern CP2 formed in the conductive layer CL2 includes only the ground plane GP, which is a large-area conductive pattern connected to the supply path of the reference potential. In addition, in FIG. 10, the plurality of conductive patterns CP3 formed in the conductive layer CL3 includes the ground plane GP, which is a large-area conductive pattern connected to the supply path of the reference potential, and the power supply plane VP, which is a large-area conductive pattern connected to the power supply potential. As described above, since it is possible to efficiently utilize the space in the conductive layer CL2 and the conductive layer CL3, each of the first occupancy ratio and the third occupancy ratio is greater than each of the second occupancy ratio and the fourth occupancy ratio, respectively. In the case of the present embodiment, the first occupancy ratio of the conductive layer CL2 shown in FIG. 9 and the third occupancy ratio of the conductive layer CL3 shown in FIG. 10 are 60% or more (e.g., approximately 65 to 80%).

As described above, in the case of the semiconductor device PKG1, the conductive layer CL2 and the conductive layer CL3 whose occupancy ratio of the conductive pattern (i.e., the metal film) is higher than those of the uppermost layer and the lowermost layer are provided. The results of experiments obtained by the inventor of this application have revealed that the warpage deformation can be suppressed by forming the conductive layer so as to have the structure composed of four or more conductive layers. In addition, it has been found that suppressing the degree of warpage deformation makes it possible to suppress the occurrence of the phenomenon in which adjacent external terminals are short-circuited in a region far from the semiconductor chip described with reference to FIG. 6.

Note that the conditions under which the inventor of this application evaluated the presence or absence of short-circuit were as follows. First, the completed semiconductor device PKG1 was placed in a heating furnace and left at 125° C. for 24 hours (baking step). Then, the semiconductor device PKG1 taken out from the heating furnace was left in an atmosphere at temperature of 30° C. and humidity of 70% to absorb moisture (moisture absorption step). Next, the semiconductor device PKG1 was mounted on the mounting board MB shown in FIG. 6 and heated to a temperature higher than the temperature at which the solder balls 50 melt, whereby the plurality of solder balls 50 and the plurality of terminals MBT are bonded with each other (reflow step). Then, the connection portion between the semiconductor device PKG1 and the mounting board MB was captured with an X-ray photograph to observe the presence or absence of short-circuit (short-circuit checking step). Next, the solder ball 50 was reheated to a melting temperature or higher to remelt the plurality of solder balls 50 in the state where the semiconductor device PKG1 was mounted on the mounting board MB (re-reflow step). Then, the connection portion between the semiconductor device PKG1 and the mounting board MB was captured with an X-ray photograph to observe the presence or absence of short-circuit (short-circuit rechecking step). Note that the time to leave the semiconductor device in the moisture absorption step was 18 hours, 96 hours, 192 hours, and 360 hours. In the case of the semiconductor device PKG1, no short-circuit was observed, even in the case of leaving it for a maximum of 360 hours.

<Detailed Structure of Wiring Substrate>

The detailed structure of the wiring substrate of the semiconductor device PKG1 will be described in order. In FIG. 9, the ground plane GP is shown as the conductive pattern CP2 formed in the conductive layer CL2. In this case, the conductive pattern CP2 has an area larger than the total area of the plurality of bonding leads 11. In addition, in FIG. 10, the ground plane GP and the power supply plane VP are shown as the conductive pattern CP3 formed in the conductive layer CL3. In this case, the conductive pattern CP3 has an area larger than the total area of the plurality of bonding leads 11. In this way, by arranging the large-area conductive pattern in each of the conductive layers CL2 and CL3, the values of the first occupancy ratio and the third occupancy ratio described above can be increased.

Moreover, although not shown, as a modification of the examples shown in FIG. 9 and FIG. 10, the conductive pattern CP2 and the conductive pattern CP3 may include wirings. In the case where a large number of signal wirings are arranged, the values of the first occupancy ratio and the third occupancy ratio decrease, but the arrangement of the signal wirings is allowable as long as the values of the first occupancy ratio and the third occupancy ratio can be maintained to be higher than the second occupancy ratio and the fourth occupancy ratio as described above.

However, when the signal wirings are formed in the conductive layer CL2 and the conductive layer CL3, the manufacturing procedure of the wiring substrate becomes complicated. For example, as an example of forming the signal wiring in the conductive layer CL2, the wiring substrate can be formed by the build-up method. In this case, the signal wiring formed in the conductive layer CL2 is electrically connected to a signal conductive pattern (via land (not shown)) in the uppermost layer via a via-wiring (not shown). When the build-up method is used, the manufacturing process of the wiring substrate is complicated. Thus, it is preferable that no signal wiring is formed in the conductive layer CL2 and the conductive layer CL3 from the viewpoint of simplifying the method of manufacturing the wiring substrate.

As shown in FIG. 2, the solder balls 50 are arranged in matrix of three or more rows along each side of the mounting surface. By arranging the solder balls 50 in three or more rows along each side is of the bottom surface 10b which is the mounting surface of the semiconductor device PKG1, the number of external terminals provided in the semiconductor device PKG1 can be increased, thereby coping with enhanced functionality. On the other hand, when the solder balls 50 are arranged in three or more rows on the outermost periphery, the risk of short-circuit in the peripheral portion increases. However, in the case of the present embodiment, the warpage deformation of the wiring substrate 10 is suppressed by forming the conductive layer so as to have the four-layer structure as described above. Thus, even in the case where the solder balls 50 are arranged in three or more rows along each side is of the bottom surface 10b, it is possible to suppress the occurrence of short-circuit.

As shown in FIG. 5, the insulating layer 10A1 and the insulating layer 10A3 are thinner than the insulating layer 10A2. As described above, for example, each of the insulating layers 10A1 and 10A3 has a thickness of approximately 30 to 50 μm, and the insulating layer 10A2 has a thickness of approximately 300 to 400 μm. However, as a modification, the insulating layer 10A1, the insulating layer 10A2, and the insulating layer 10A3 may have approximately the same or similar thickness.

Further, as described above, each of the second occupancy ratio and the fourth occupancy ratio is preferably less than 60%, and each of the first occupancy ratio and the third occupancy ratio is preferably 60% or more. In addition, each of the first occupancy ratio and the third occupancy ratio is preferable as high as possible and particularly preferably 70% or more from the viewpoint of preventing warpage deformation.

Incidentally, as already described above, the conductive pattern CP2 and the conductive pattern CP3 shown in FIG. 5 contribute to suppressing the warpage deformation of the wiring substrate 10. Moreover, the conductive pattern CP2 and the conductive pattern CP3 may be so-called floating metal films that are not electrically connected to the semiconductor chip 20 from the viewpoint of simply preventing the warpage deformation. However, a fixed potential is preferably supplied to the conductive pattern CP2 and the conductive pattern CP3 from the viewpoint of eliminating an adverse electrical effect on the signal transmission path. In the present embodiment, the conductive pattern CP2 and the conductive pattern CP3 are electrically connected to the bump land 12 to which a fixed potential is supplied, among the plurality of bump lands 12. Specifically, each of the ground plane GP shown in FIG. 9 and the ground plane GP shown in FIG. 10 is electrically connected to the bump land 12 (see FIG. 5) constituting a path through which a reference potential is supplied. In addition, the power supply plane VP shown in FIG. 10 is electrically connected to the bump land 12 constituting a path through which a power supply potential is supplied. In the present embodiment, one power supply plane VP is shown as the supply path of the power supply potential, but multiple different types of power supply potentials may be supplied in some cases depending on the specifications of the semiconductor device PKG1. In this case, the power supply planes VP separated from each other for each type of power supply potential may be provided in some cases.

Preferred Embodiment

Next, some preferred embodiments as measures for preventing the short-circuit will be described. Even when various measures described below are executed, short-circuit may occur in some cases if the degree of warpage deformation of the wiring substrate 10 is large. However, the occurrence of short-circuit can be further suppressed by forming four or more conductive layers as in the semiconductor device PKG1 and executing some or all the measures described below.

Even if short-circuit occurs in the corner region CR shown in FIG. 8, it is possible to eliminate the occurrence of trouble due to the short-circuit by supplying the same potential (e.g., reference potential or power supply potential) to the bump lands 12 arranged in the corner region CR. In addition, since it is possible to prevent short-circuit in the corner region CR, the bump land 12 for signal transmission can be arranged in the corner region CR. In other words, according to the present embodiment, the degree of layout freedom can be increased without limiting the type of bump land 12.

As described with reference to FIG. 5, the side surfaces of each of the plurality of bump lands 12 are exposed from the insulating film 10B2 and are in contact with the solder balls 50. Namely, the NSMD type is employed. In the case of the NSMD type, the bonding strength between the solder balls 50 and the bump lands 12 is high, but some of the solder balls 50 tend to flow in the lead-out direction from the bump land 12 to the through-hole land 16 as described above. Thus, if the lead-out direction of the lead-out wiring portion from the bump land 12 to the through-hole land 16 (the portion between the bump land 12 and the through-hole land 16 in the conductive pattern CP4 including the bump land 12) is at random, adjacent solder balls may be short-circuited.

Thus, in the example shown in FIG. 8, the lead-out directions from the bump lands 12 to the through-hole lands 16 (i.e., the extending directions of the lead-out wiring portions) are aligned in the corner regions CR in which short-circuit is likely to occur. Specifically, the wiring substrate 10 has four sides is and four corners 1c where the four sides is intersect in plan view, and a region in which three columns and three rows of the bump lands 12 in order of proximity to each of the four corners 1c are arranged is defined as a corner region CR. In each of the four corner regions CR, the extending directions of the lead-out wiring portions led out from the bump lands 12 to the through-hole lands 16 are the same direction.

Figure 11:
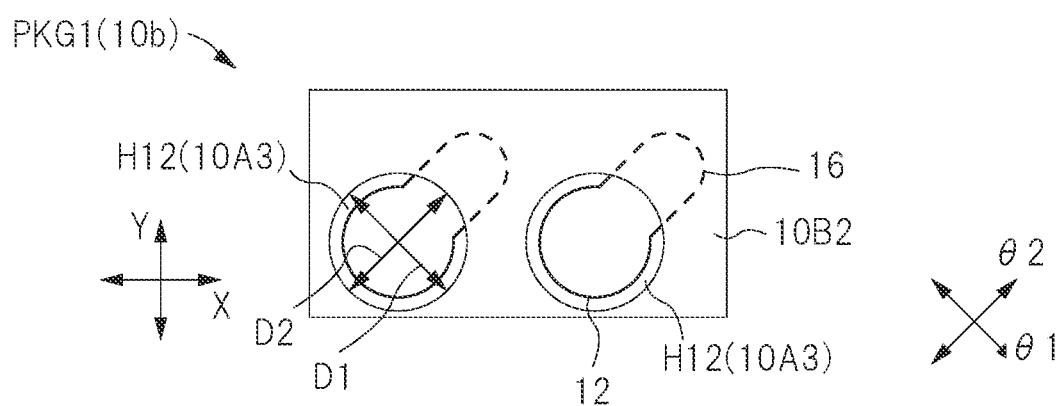
FIG. 11 is an enlarged plan view showing an example of the relationship between a bump land arranged in a corner region shown in FIG. 8 and an opening formed in a solder resist film.
Figure 12:
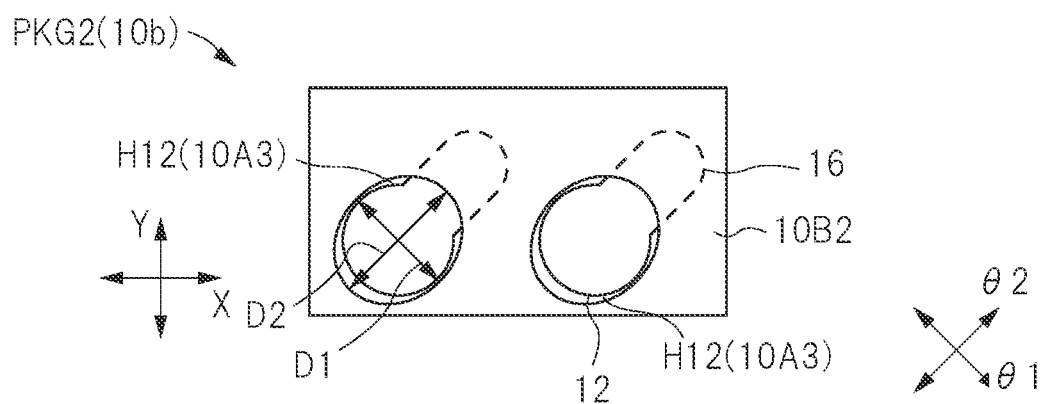
FIG. 12 is an enlarged plan view showing a modification with respect to FIG. 11.

FIG. 11 is an enlarged plan view showing an example of the relationship between the bump land arranged in the corner region shown in FIG. 8 and the opening formed in a solder resist film. FIG. 12 is an enlarged plan view showing a modification with respect to the example shown in FIG. 11.

In both the semiconductor device PKG1 shown in FIG. 11 and a semiconductor device PKG2 shown in FIG. 12, each of the plurality of bump lands 12 arranged in the corner region CR (see FIG. 8) is exposed from the insulating film 10B2 at an opening H12 formed in the insulating film 10B2.

FIG. 11 and FIG. 12 differ in the shape of the opening H12. Specifically, in the example shown in FIG. 11, the opening H12 is circular. Focusing on the opening diameter of the opening H12, in the case of the example shown in FIG. 11, a length D1 in a first direction ($\theta$1 direction) orthogonal to an extending direction ($\theta$2 direction) of the lead-out wiring portion connected to the bump land 12 and a length D2 in a second direction ($\theta$2 direction) orthogonal to the first direction are identical.

On the other hand, in the case of the example shown in FIG. 12, as for the opening diameter of the opening H12 in the corner region, the length D1 in the first direction ($\theta$1 direction) orthogonal to the extending direction ($\theta$2 direction) of the lead-out wiring portion that is led from the bump land 12 to the through-hole land 16 described above is shorter than the length D2 in the second direction ($\theta$2 direction) orthogonal to the first direction.

In the case of the NSMD type, it is possible to improve the reliability of bonding between the solder ball 50 (see FIG. 5) and the bump land 12, but the shape of the solder balls 50 tends to be large along the X-Y plane shown in FIG. 8. On the other hand, in the example shown in FIG. 12, although the NSMD type is employed, the structure similar to that of the SMD type is formed in the arrangement direction of the bump lands 12 by shortening the length D2. In this case, since the solder balls 50 are less likely to spread in the arrangement directions (X and Y directions) of the bump lands 12, it is possible to prevent the short-circuit of the solder balls 50 adjacent to each other in the X direction.

Moreover, in the examples shown in FIG. 11 and FIG. 12, the $\theta$1 direction forms an angle of −45 degrees with respect to the X direction, and the $\theta$2 direction forms an angle of 45 degrees with respect to the X direction.

As examples of measures for preventing short-circuit other than those described above, the short-circuit may be prevented by adjusting the layout of the solder balls 50, adjusting the ball diameter of the solder balls 50, or adjusting the amount of solder paste applied to the mounting board at the time of packaging. Each of FIG. 13 to FIG. 15 is a plan view showing a modification with respect to the example shown in FIG. 2.

Figure 13:
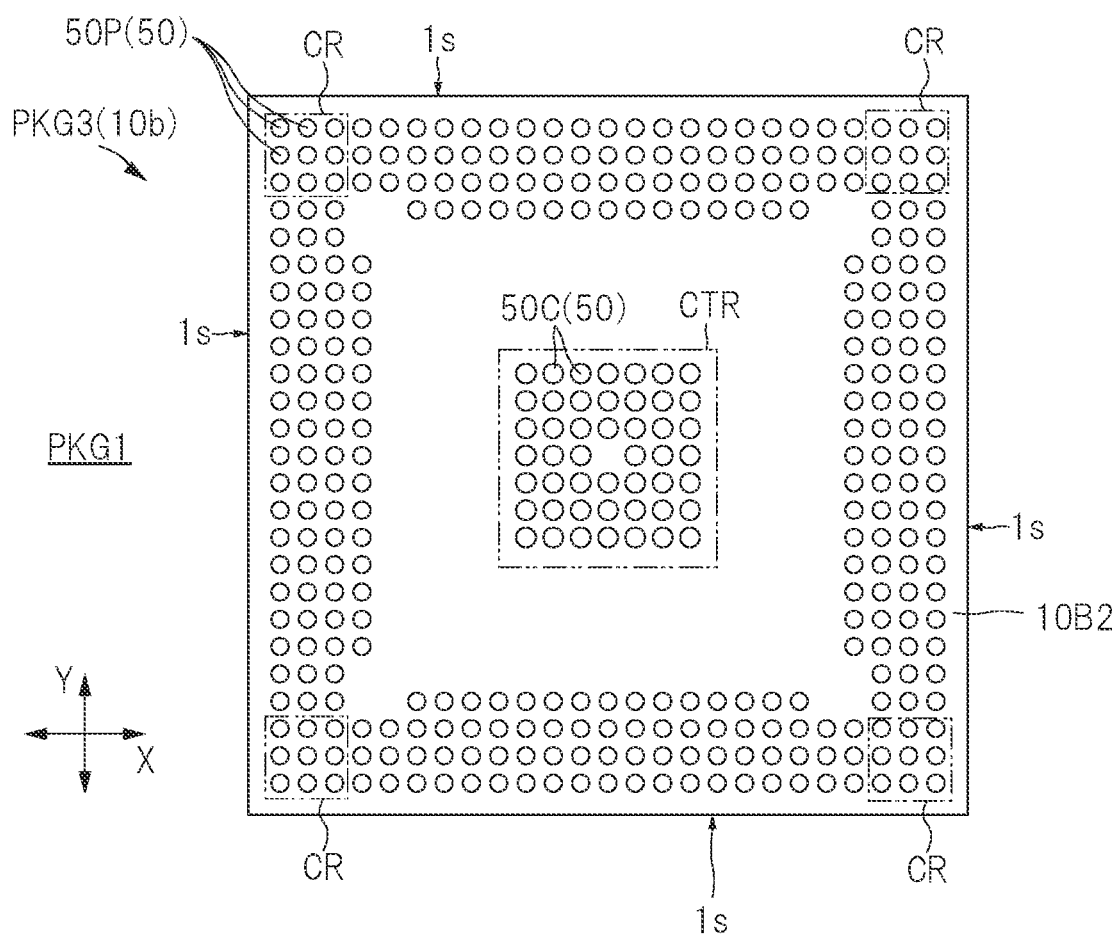
FIG. 13 is a plan view showing a modification with respect to FIG. 2.

A semiconductor device PKG3 shown in FIG. 13 differs from the embodiment shown in FIG. 2 in that a ball diameter of a solder ball 50P arranged in the peripheral region including the corner region CR is smaller than a ball diameter of a solder ball 50C arranged in a central region CTR overlapping the semiconductor chip 20 (see FIG. 5). For example, the ball diameter of the solder ball 50C is 500 μm, and the ball dimeter of the solder ball 50P arranged in the corner region CR is 450 μm. By relatively decreasing the ball diameter of the solder balls 50P arranged in the corner region CR, it is possible to reduce the difference in ball height between the central region CTR and the corner region CR. This prevents the solder ball 50 from being excessively crushed in the corner regions CR during packaging. In addition, in the case where the ball diameter of the solder ball 50P is small, even if the solder ball 50P is crushed during packaging, the distance between the adjacent solder balls 50P can be maintained. As a result, it is possible to suppress the occurrence of short-circuit.

Figure 14:
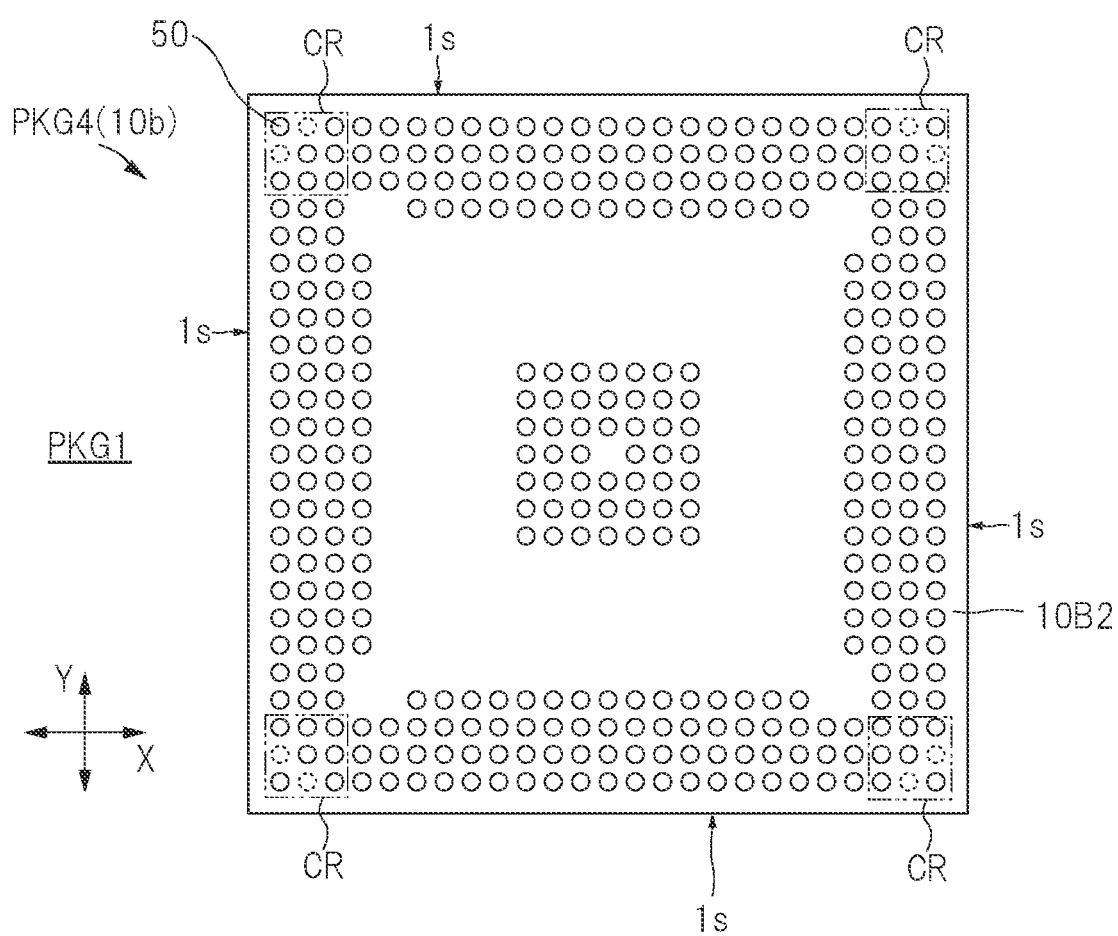
FIG. 14 is a plan view showing another modification with respect to FIG. 2.

A semiconductor device PKG4 shown in FIG. 14 differs from the semiconductor device PKG1 shown in FIG. 2 in that the corner region CR has a no-solder-ball location where the solder ball 50 is not arranged. In FIG. 14, the locations where no solder ball is arranged are indicated by dotted lines. The no-solder-ball location means a state in which the solder ball 50 is not arranged at the location where the solder ball 50 should be arranged according to the original ball arrangement rule (e.g., the rule of arranging the balls in a grid pattern). By providing the no-solder-ball location in the corner region CR, the separation distance between the solder balls 50 adjacent to each other can be made wider in the corner region CR than in other regions. As a result, it is possible to suppress the occurrence of short-circuit in the corner region CR.

Figure 15:
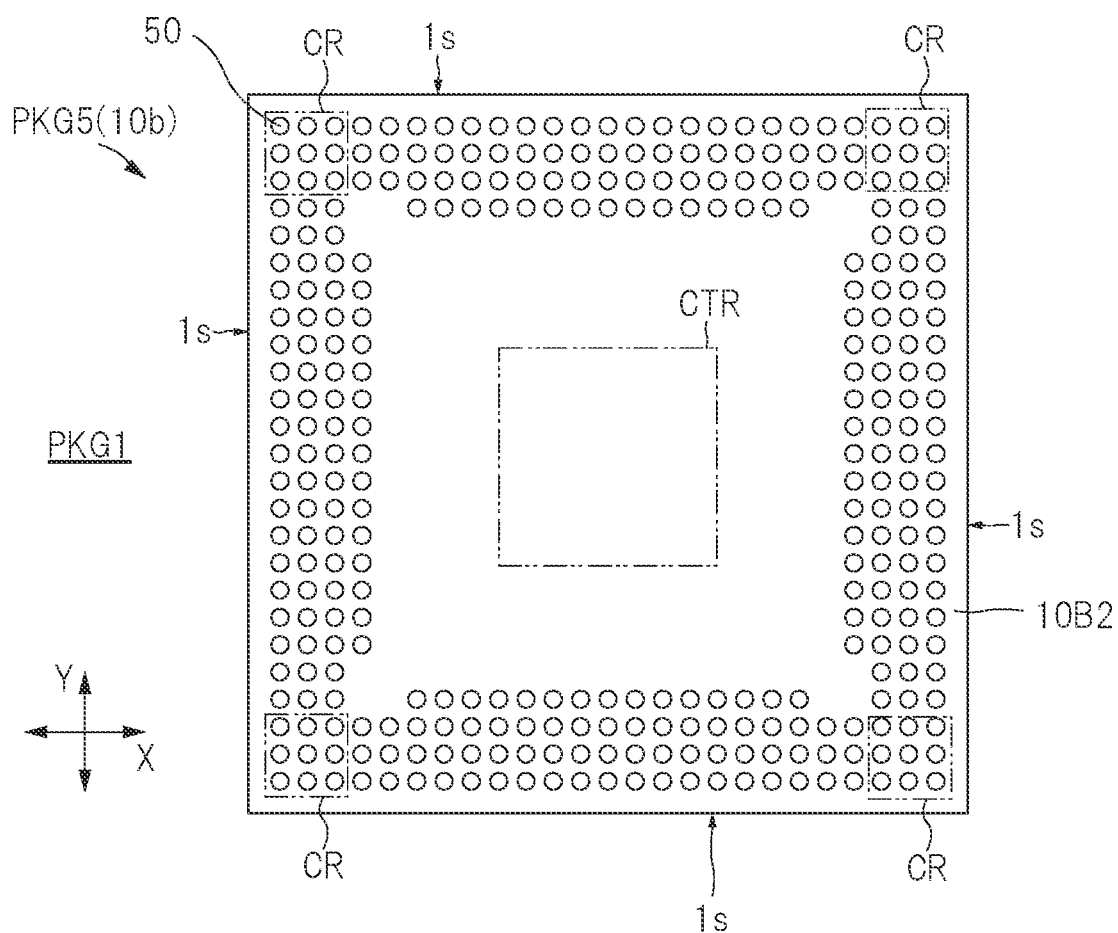
FIG. 15 is a plan view showing another modification with respect to FIG. 2.

A semiconductor device PKG5 shown in FIG. 15 differs from the semiconductor device PKG1 shown in FIG. 2 in that the solder ball 50 is not arranged in the central region CTR overlapping the semiconductor chip 20 (see FIG. 5).

Since the solder ball 50 is not arranged in the central region CTR in the case of the semiconductor device PKG5, the solder balls 50 arranged in the peripheral region are only necessary to be connected to the terminals MBT (see FIG. 6) of the mounting board MB (see FIG. 6). In the case where the solder ball 50 is arranged in the central region CTR as shown in FIG. 2, the upper limit of the distance between the wiring substrate 10 and the mounting board MB in the central region CTR is restricted by the solder ball 50 in the central region CTR. When the warpage deformation occurs in the wiring substrate 10, the distance between the wiring substrate and the mounting board becomes further smaller in the peripheral region. As a result, the amount of deformation of the solder ball 50 in the peripheral region becomes larger, and the short-circuit described above is likely to occur. On the other hand, in the case where the solder ball 50 is not arranged in the central region CTR as in this modification, the upper limit of the distance between the wiring substrate 10 and mounting board MB in the central region CTR is not particularly restricted. As a result, the amount of deformation of the solder ball 50 in the peripheral region can be reduced, and the short-circuit is less likely to occur. However, the solder ball 50 arranged in the central region CTR (see FIG. 2) functions as a heat dissipation path (thermal ball) for releasing the heat of the semiconductor chip 20 (see FIG. 5) to the side of the mounting board. Therefore, it is preferable that the solder ball 50 is arranged in the central region CTR from the viewpoint of improving the heat dissipation characteristics of the semiconductor device.

Further, though not shown, there is a packaging method in which a solder paste is applied in advance on each of the plurality of terminals MBT of the mounting board MB when packaging, for example, the semiconductor device PKG1 (see FIG. 5) on the mounting board MB shown in FIG. 6. In this case, if the amount of solder paste applied on the terminal MBT located at the position facing the corner region CR (see FIG. 8) is made smaller than the amount of solder paste applied on other terminals MBT, the occurrence of short-circuit can be suppressed.

Further, according to the studies by the inventor of this application, when the warpage deformation occurs in the semiconductor device, the semiconductor device deforms such that the vicinity of the semiconductor chip 20 forms a convex shape in the deforming direction as shown in FIG. 6. As a method of suppressing the warpage deformation by utilizing this characteristic, the following method can be presented. Namely, when packaging the semiconductor device on the mounting board MB, the semiconductor device and the mounting board are heated. At this time, if the amount of heat applied from the side of the mounting board is greater than the amount of heat applied from the side of the semiconductor device, the degree of warpage deformation of the semiconductor device PKGX shown in FIG. 6 is suppressed. However, this method is also effective when the conductive layer is formed to have a structure including four or more layers as in the semiconductor device PKG1 shown in FIG. 5.

Figure 16:
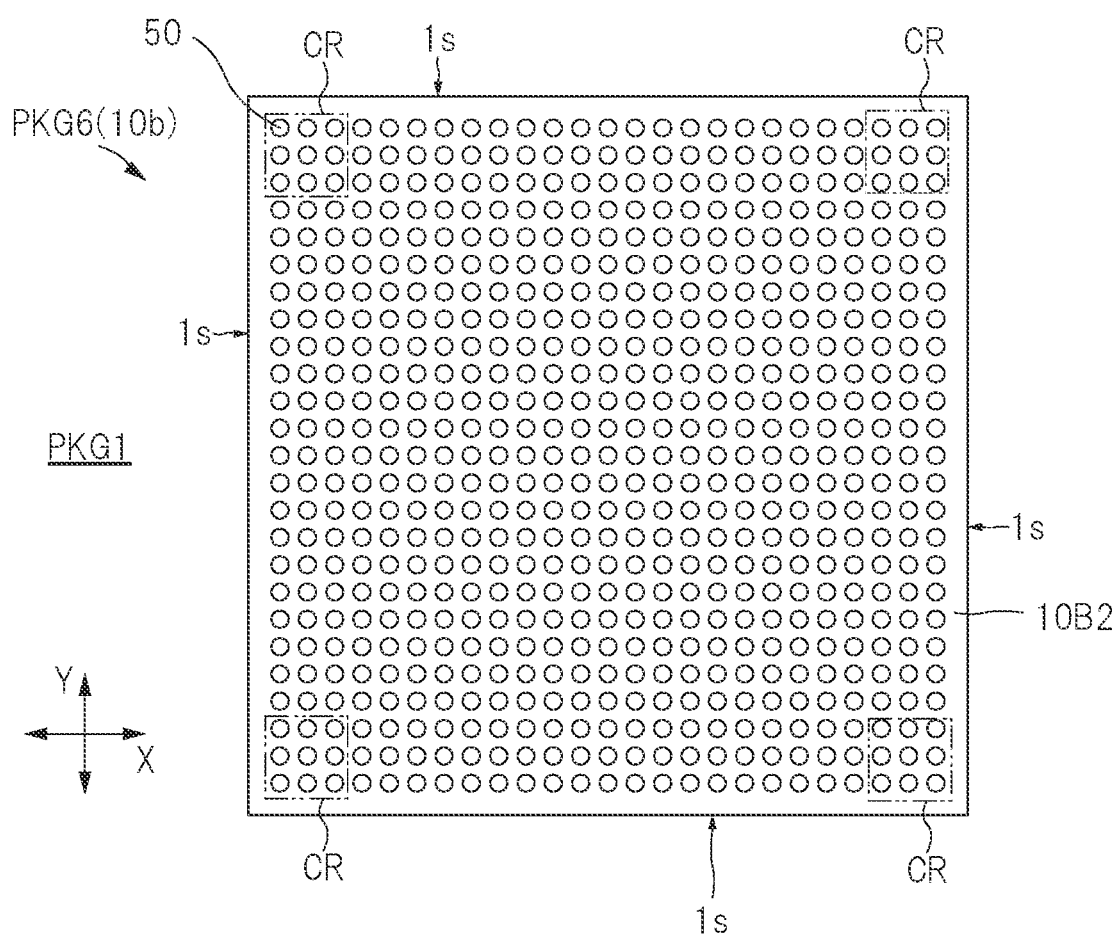
FIG. 16 is a plan view showing another modification with respect to FIG. 2.

Note that the layout of the solder balls 50 has various modifications in addition to the examples shown in FIG. 2 and FIG. 13 to FIG. 15. For example, as in a semiconductor device PKG6 shown in FIG. 16, the solder balls 50 may be arranged in a full grid (state in which the solder balls 50 arranged in a grid pattern are arranged at all grid points) in some cases. The measures for preventing warpage deformation and the measures for preventing short-circuit described above are particularly effective when applied to a semiconductor device in which 400 or more solder balls 50 (i.e., bump lands) are provided in a full grid.

Although the invention made by the inventor of this application has been specifically described based on the embodiments, but it is needless to say that the present invention is not limited to the embodiments described above and can be modified in various ways within the scope not departing from the gist thereof.

What is claimed is:

1. A semiconductor device comprising:
a wiring substrate including: a plurality of bonding leads arranged on a chip mounting surface, and a plurality of bump lands arranged on a mounting surface opposite the chip mounting surface;
a semiconductor chip mounted on the chip mounting surface of the wiring substrate;
a plurality of bonding wires electrically connected the semiconductor chip with the plurality of bonding leads;
a sealing body sealing the semiconductor chip and the plurality of bonding wires; and
a plurality of solder balls connected to the plurality of bump lands, respectively,
wherein the wiring substrate includes:
a first insulating layer having a first surface and a second surface opposite the first surface;
a first conductive layer having a first conductive pattern, and formed on the first surface of the first insulating layer;
a second insulating layer formed on the first surface of the first insulating layer so as to cover the first conductive layer;
a second conductive layer having a second conductive pattern including the plurality of bonding leads, and formed on the second insulating layer;
a first solder resist film formed on the second insulating layer so as to expose each of the plurality of bonding leads;
a third conductive layer having a third conductive pattern, and formed on the second surface of the first insulating layer;
a third insulating layer formed on the second surface of the first insulating layer so as to cover the third conductive layer;
a fourth conductive layer having a fourth conductive pattern including the plurality of bump lands, and formed on the third insulating layer; and
a second solder resist film formed on the third insulating layer so as to expose each of the plurality of bump lands,
wherein a shape of each of the chip mounting surface and the mounting surface is comprised of a quadrangular having a side whose length is 20 mm or more,
wherein, in plan view, the semiconductor chip is comprised of a quadrangular, an area of the semiconductor chip being less than 10% of an area of the chip mounting surface,
wherein, in plan view, the semiconductor chip is mounted in a central region including a center of the chip mounting surface,
wherein the first insulating layer contains: a glass fiber; and an epoxy resin impregnated in the glass fiber,
wherein, given that an occupancy ratio of the first conductive pattern in the first conductive layer is a first occupancy ratio, an occupancy ratio of the second conductive pattern in the second conductive layer is a second occupancy ratio, an occupancy ratio of the third conductive pattern in the third conductive layer is a third occupancy ratio, and an occupancy ratio of the fourth conductive pattern in the fourth conductive layer is a fourth occupancy ratio, each of the first occupancy ratio and the third occupancy ratio is greater than each of the second occupancy ratio and the fourth occupancy ratio, wherein the second conductive layer includes the plurality of bonding leads, a plurality of wirings respectively connected to the plurality of bonding leads, and a plurality of first through-hole lands respectively connected to the plurality of wirings, wherein the fourth conductive layer includes the plurality of bump lands and a plurality of second through-hole lands respectively connected to the plurality of bump lands, wherein the plurality of first through-hole lands and the plurality of second through-hole lands are connected via a plurality of through-hole wirings with each other, wherein a plurality of openings is formed in each of the first conductive pattern and the third conductive pattern, wherein the plurality of through-hole wirings is formed so as to pass through the plurality of openings, respectively, of each of the first conductive pattern and third conductive pattern, wherein a side surface of each of the plurality of bump lands is exposed from the second solder resist film, and is in contact with the respective solder ball, wherein the wiring substrate has four sides and four corners, wherein each of the four sides has a length of 20 mm or more, and wherein, given that a region in which three columns and three rows of the plurality of bump lands in order of proximity to each corner are arranged is defined as a corner region, in each of the four corner regions, each extending direction of each lead-out wiring portion led out from each bump land to each second through-hole land are the same as each other.

2. The semiconductor device according to claim 1,
wherein the plurality of solder balls is arranged in a matrix along each side of the mounting surface, and
wherein a center-to-center distance between two solder balls of the plurality of solder balls, which are adjacent to each other, is 800 μm or less.

3. The semiconductor device according to claim 1,
wherein an area of the first conductive pattern is larger than a total area of the plurality of bonding leads, and
wherein an area of the third conductive pattern is larger than the total area of the plurality of bonding leads.

4. The semiconductor device according to claim 1, wherein the plurality of solder balls is arranged in a matrix in three or more rows along each side of the mounting surface.

5. The semiconductor device according to claim 1, wherein a thickness of each of the second insulating layer and the third insulating layer is thinner than a thickness of the first insulating layer.

6. The semiconductor device according to claim 1,
wherein each of the second occupancy ratio and the fourth occupancy ratio is less than 60%, and
wherein each of the first occupancy ratio and the third occupancy ratio is 60% or more.

7. The semiconductor device according to claim 1, wherein a number of the plurality of bump lands is 400 or more.

8. The semiconductor device according to claim 1, wherein the sealing body includes a resin body containing: a thermosetting resin; and multiple inorganic filler particles contained in the resin body.

9. The semiconductor device according to claim 1, wherein the semiconductor chip includes a semiconductor substrate made of single-crystal silicon.

10. The semiconductor device according to claim 1, wherein each of the first conductive pattern and the third conductive pattern is electrically connected to a bump land of the plurality of bump lands, to which a fixed potential is to be supplied.

11. The semiconductor device according to claim 1, wherein each of the second insulating layer and the third insulating layer contains: a glass fiber; and an epoxy resin impregnated in the glass fiber.

12. The semiconductor device according to claim 1,
wherein each of the plurality of bump lands arranged in each of the four corner regions is exposed from the second solder resist film in an opening formed in the second solder resist film, and
wherein, as for an opening diameter of the opening in each of the four corner regions, a length in a first direction orthogonal to the extending direction of the lead-out wiring portion is shorter than a length in a second direction orthogonal to the first direction.

* * * * *